United States Patent
Konishi et al.

(10) Patent No.: US 12,317,640 B2
(45) Date of Patent: May 27, 2025

(54) SOLAR CELL AND METHOD FOR MANUFACTURING SOLAR CELL

(71) Applicant: KANEKA CORPORATION, Osaka (JP)

(72) Inventors: Katsunori Konishi, Settsu (JP); Daisuke Adachi, Settsu (JP)

(73) Assignee: KANEKA CORPORATION, Osaka (JP)

( * ) Notice: Subject to any disclaimer, the term of this patent is extended or adjusted under 35 U.S.C. 154(b) by 112 days.

(21) Appl. No.: 18/478,380

(22) Filed: Sep. 29, 2023

(65) Prior Publication Data

US 2024/0021742 A1  Jan. 18, 2024

Related U.S. Application Data

(63) Continuation of application No. PCT/JP2022/015204, filed on Mar. 28, 2022.

(30) Foreign Application Priority Data

Mar. 30, 2021  (JP) ................................ 2021-057529

(51) Int. Cl.
  *H10F 77/70* (2025.01)
  *H10F 10/166* (2025.01)
  *H10F 71/00* (2025.01)

(52) U.S. Cl.
  CPC ........... *H10F 77/70* (2025.01); *H10F 10/166* (2025.01); *H10F 71/00* (2025.01)

(58) Field of Classification Search
  CPC ......... H10F 77/70; H10F 10/166; H10F 71/00
  See application file for complete search history.

(56) References Cited

U.S. PATENT DOCUMENTS

| | | | | |
|---|---|---|---|---|
| 2005/0062041 A1* | 3/2005 | Terakawa | ............ | H10F 10/166 257/53 |
| 2013/0247974 A1* | 9/2013 | Moriyama | ............ | H10F 77/703 438/71 |
| 2014/0034119 A1* | 2/2014 | Lee | ........................ | H10F 10/172 136/255 |

(Continued)

FOREIGN PATENT DOCUMENTS

| | | |
|---|---|---|
| JP | H07-106612 A | 4/1995 |
| JP | 2005-101151 A | 4/2005 |

(Continued)

OTHER PUBLICATIONS

International Search Report issued in PCT/JP2022/015204; mailed May 24, 2022.

*Primary Examiner* — Jayne L Mershon
(74) *Attorney, Agent, or Firm* — Studebaker Brackett PLLC

(57) ABSTRACT

A solar cell for achieving an increase in performance. The solar cell is a back junction solar cell comprising a semiconductor substrate, first semiconductor layers stacked in a first region which is a part of the back side of the semiconductor substrate, and second semiconductor layers stacked in a second region which is another part of the back side of the semiconductor substrate. In the second region, the first semiconductor layers are present in some parts between the semiconductor substrate and the second semiconductor layers, wherein the first semiconductor layers comprise sea shapes in a sea-island structure.

20 Claims, 16 Drawing Sheets

(56) References Cited

U.S. PATENT DOCUMENTS

2015/0255666 A1\* 9/2015 Bedell ..................... H10F 19/35
438/58

FOREIGN PATENT DOCUMENTS

| JP | 2014-075526 A | 4/2014 |
| JP | 2018-163999 A | 10/2018 |
| KR | 10-2014-0019099 A1 | 2/2014 |
| WO | 2012/036002 A1 | 3/2012 |

\* cited by examiner

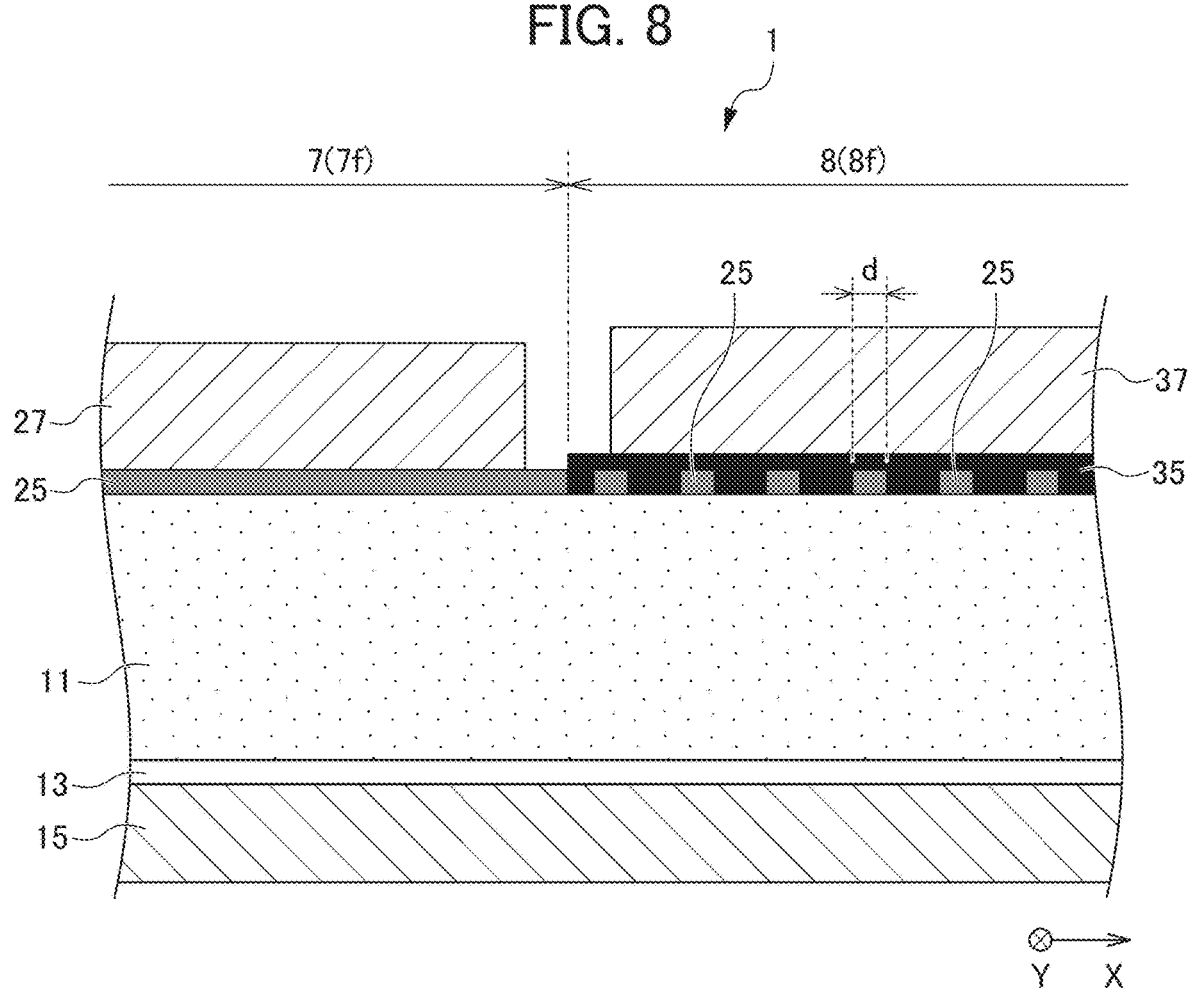

SOLAR CELL AND METHOD FOR MANUFACTURING SOLAR CELL

CROSS-REFERENCE TO RELATED APPLICATIONS

This application claims benefit of priority to International Patent Application No. PCT/JP2022/015204, filed Mar. 28, 2022, and to Japanese Patent Application No. 2021-057529, filed Mar. 30, 2021, the entire contents of each are incorporated herein by reference.

BACKGROUND

Technical Field

The present disclosure relates to a back-junction solar cell, and a method of manufacturing a back-junction solar cell.

Background Art

There are two types of solar cells including a semiconductor substrate: a double-sided electrode solar cell, which has electrodes formed on both the light-receiving surface side and the back surface side; and a back-electrode solar cell (hereinafter also referred to as a back-junction solar cell or a back-contact solar cell), which has electrodes formed only on the back surface side. In the double-sided electrode solar cell, the solar light is shaded by the electrodes formed on the light-receiving surface side. On the other hand, in the back-electrode solar cell, the electrodes are not formed on the light-receiving surface side, therefore the light-receiving rate of the solar light is higher than the double-sided electrode solar cell. Japanese Unexamined Patent Application, Publication No. 2014-75526 discloses a back-electrode solar cell.

The solar cell described in Japanese Unexamined Patent Application, Publication No. 2014-75526 includes a semiconductor substrate that functions as a photoelectric conversion layer; a first intrinsic semiconductor layer and a first conductivity-type semiconductor layer (first semiconductor layer) as well as a first electrode layer, which are deposited in order on a part of the back surface side (first region) of the semiconductor substrate; and a second intrinsic semiconductor layer and a second conductivity-type semiconductor layer (second semiconductor layer) as well as a second electrode layer, which are deposited in order on another part of the back surface side (second region) of the semiconductor substrate.

SUMMARY

The manufacturing process of the back-junction solar cell involves patterning the first semiconductor layer (first patterning), and patterning the second semiconductor layer (second patterning). When patterning the first semiconductor layer, a material film of the first semiconductor layer is formed on the entire surface on the back surface side of the semiconductor substrate, then the material film of the first semiconductor layer in the second region on the back surface side of the semiconductor substrate is removed, to form a first semiconductor layer patterned in the first region on the back surface side of the semiconductor substrate. At this time, the back surface of the semiconductor substrate in the second region is exposed.

The inventor of the present application has found that by suppressing the exposure of the back surface of the semiconductor substrate during the patterning process of the first semiconductor layer, the lifetime of the carriers in the semiconductor substrate is improved, and as a result, the performance of the solar cell is improved.

Accordingly, the present disclosure provides a solar cell and a method of manufacturing a solar cell, which can improve the performance.

The solar cell according to the present disclosure is a back-junction solar cell, in which the solar cell includes: a semiconductor substrate; a first semiconductor layer deposited on a first region as part of one principal surface side of the semiconductor substrate; and a second semiconductor layer deposited on a second region as another part of the one principal surface side of the semiconductor substrate. In the second region, the first semiconductor layer exists in a part between the semiconductor substrate and the second semiconductor layer, and the first semiconductor layer is in a sea shape or an island shape in a sea-island structure.

The method of manufacturing a solar cell according to the present disclosure is a method of manufacturing a back-junction solar cell, in which the solar cell includes: a semiconductor substrate, a first semiconductor layer deposited on a first region as part of one principal surface side of the semiconductor substrate, and a second semiconductor layer deposited on a second region as another part of the one principal surface side of the semiconductor substrate, and the method includes: a first semiconductor layer material film forming step of forming a material film of the first semiconductor layer on the one principal surface side of the semiconductor substrate; a resist forming step of forming a resist on the material film of the first semiconductor layer in the first region; a first semiconductor layer forming step of etching the material film of the first semiconductor layer in the second region using the resist as a mask, to form the first semiconductor layer patterned in the first region; a resist removing step of removing the resist; and a second semiconductor layer forming step of forming the second semiconductor layer patterned in the second region. In the first semiconductor layer forming step, etching is performed to leave the first semiconductor layer in a sea shape or an island shape in a sea-island structure in the second region; and in the second semiconductor layer forming step, the first semiconductor layer exists in a part between the semiconductor substrate and the second semiconductor layer.

According to the present disclosure, the performance of a back-junction solar cell can be improved.

BRIEF DESCRIPTION OF THE DRAWINGS

FIG. 8 is a cross-sectional view of the solar cell according to the Modification Example of the present embodiment, which is equivalent to the cross-sectional view along the line II-II in FIG. 1;

DETAILED DESCRIPTION

Figure 1:
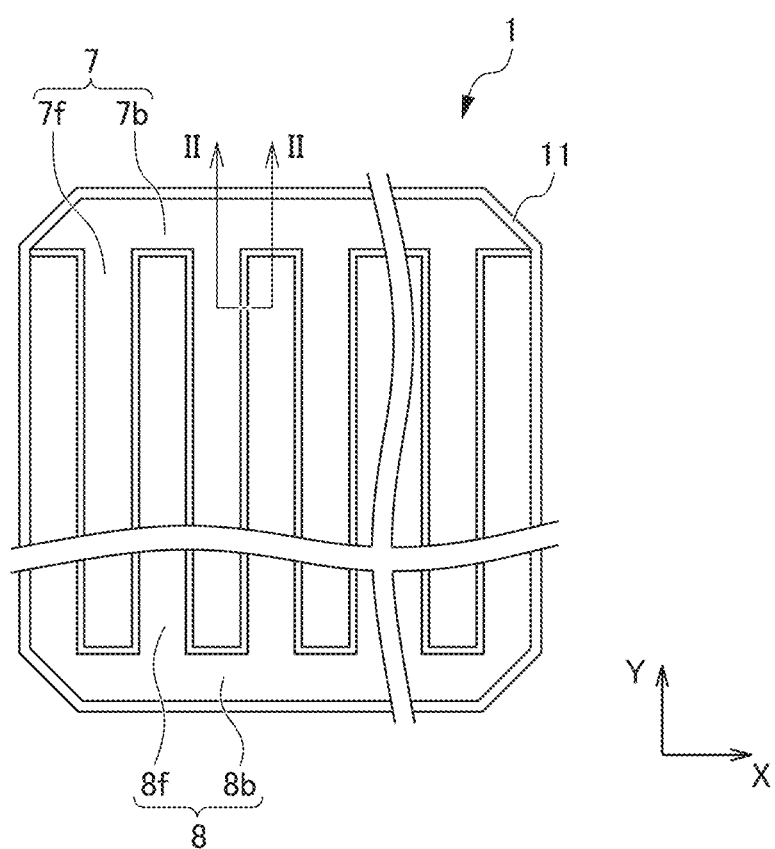
FIG. 1 is a view of a solar cell according to the present embodiment as viewed from the back surface side.

Hereinafter, one example of an embodiment of the present disclosure will be described with reference to the accompanying drawings. Note that the same or equivalent parts in each drawing will be designated with the same reference numerals. Also, for convenience, hatching and part numbers, etc., may be omitted; in such cases, other drawings should be referred to.

(Solar Cell)

Figure 2:
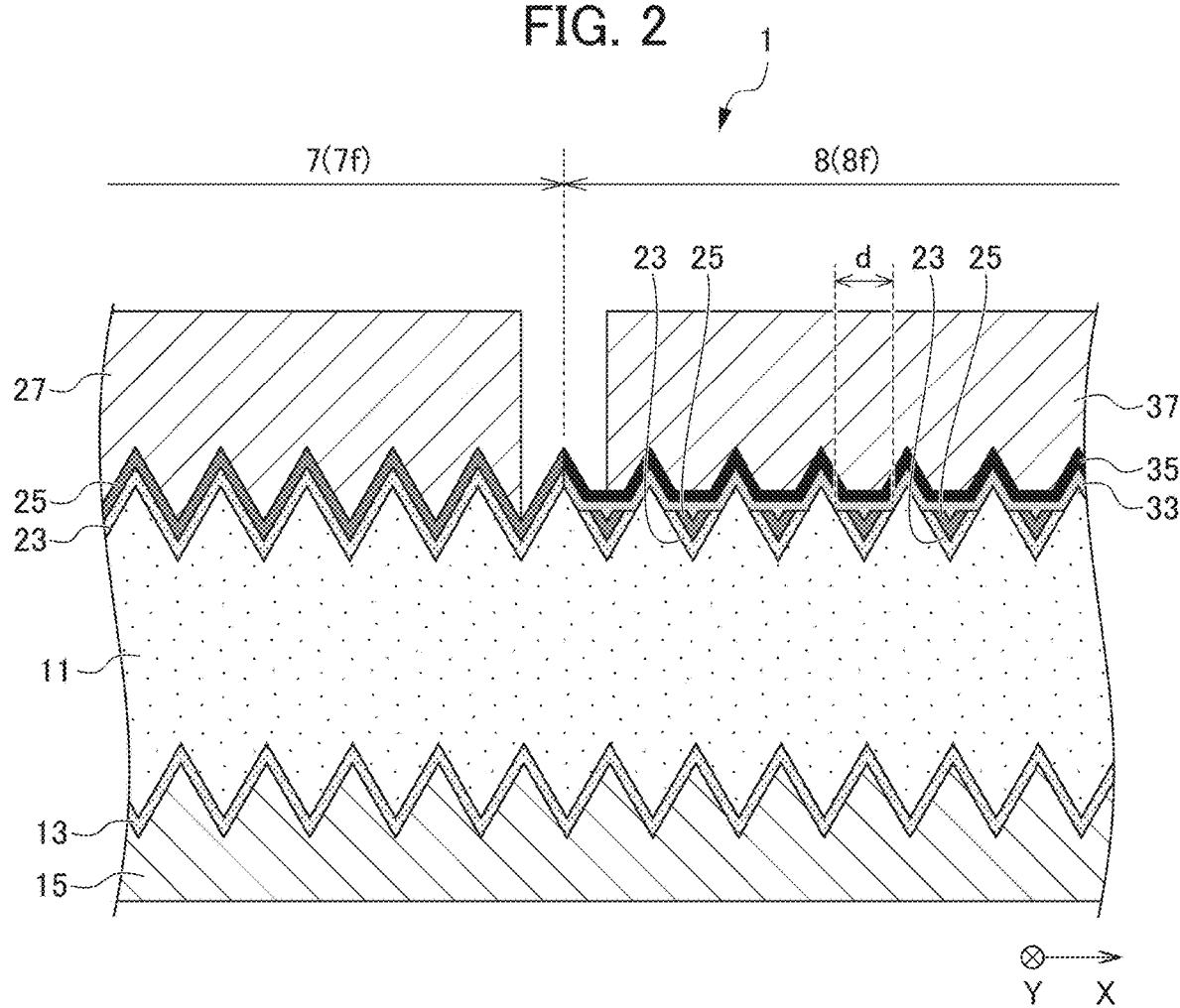
FIG. 2 is a cross-sectional view of the solar cell along the line II-II in FIG. 1.

FIG. 1 is a view of a solar cell according to the present embodiment as viewed from the back surface side, and FIG. 2 is a cross-sectional view of the solar cell along the line II-II in FIG. 1. A solar cell 1 illustrated in FIGS. 1 and 2 is a back-junction solar cell (also referred to as a back-contact solar cell or a back-electrode solar cell). Note that in the present embodiment, a heterojunction solar cell is described as an example of a solar cell, but the solar cell of the present disclosure is not limited to the heterojunction solar cell.

The solar cell 1 includes a semiconductor substrate 11 having two principal surfaces, in which the principal surface of the semiconductor substrate 11 includes a first region 7 and a second region 8. Hereinafter, the principal surface on the light-receiving surface side of the semiconductor substrate 11 is referred to as a light-receiving surface, and another principal surface (one principal surface) on the side opposite to the light-receiving surface of the semiconductor substrate 11 is referred to as a back surface.

The first region 7 has a so-called comb-like shape, and includes a plurality of finger parts 7f which correspond to the teeth of the comb, and a busbar part 7b which corresponds to the support part of the comb teeth. The busbar part 7b extends in a first direction (X direction) along one edge of the semiconductor substrate 11, and the finger parts 7f extend from the busbar part 7b in a second direction (Y direction) that crosses the first direction.

Similarly, the second region 8 also has a so-called comb-like shape, and includes a plurality of finger parts 8f which correspond to the teeth of the comb, and a busbar part 8b which corresponds to the support part of the comb teeth. The busbar part 8b extends in the first direction (X direction) along the other edge of the semiconductor substrate 11 that opposes the one edge, and the finger parts 8f extend from the busbar part 8b in the second direction (Y direction).

The finger parts 7f and the finger parts 8f form a band extending in the second direction (Y direction), and are alternately provided in the first direction (X direction). Note that the first region 7 and the second region 8 may be formed in a stripe shape.

As illustrated in FIG. 2, the solar cell 1 includes a third intrinsic semiconductor layer 13 and an optical adjustment layer 15 which are deposited in order on the light-receiving surface side of the semiconductor substrate 11. The solar cell 1 includes a first intrinsic semiconductor layer 23, a first conductivity-type semiconductor layer 25, and a first electrode layer 27, which are deposited in order on a part (the first region 7) of the back surface side of the semiconductor substrate 11. The solar cell 1 includes a second intrinsic semiconductor layer 33, a second conductivity-type semiconductor layer 35, and a second electrode layer 37, which are deposited in order on another part (the second region 8) of the back surface side of the semiconductor substrate 11.

Hereinafter, the first intrinsic semiconductor layer 23 and the first conductivity-type semiconductor layer 25 are collectively referred to as the first semiconductor layer, and the second intrinsic semiconductor layer 33 and the second conductivity-type semiconductor layer are collectively referred to as the second semiconductor layer. That is, the first semiconductor layer includes the first conductivity-type semiconductor layer 25, and the first intrinsic semiconductor layer 23 on the semiconductor substrate 11 side of the first conductivity-type semiconductor layer 25; and the second semiconductor layer includes the second conductivity-type semiconductor layer 35, and the second intrinsic semiconductor layer 33 on the semiconductor substrate 11 side of the second conductivity-type semiconductor layer 35.

The semiconductor substrate 11 is formed from a crystalline silicon material such as monocrystalline silicon or polycrystalline silicon. The semiconductor substrate 11 is an n-type semiconductor substrate, in which an n-type dopant is doped into the crystalline silicon material. The semiconductor substrate 11 may also be a p-type semiconductor substrate, in which a p-type dopant is doped into the crystalline silicon material. An example of the n-type dopant is phosphorus (P). An example of the p-type dopant is boron (B). The semiconductor substrate 11 functions as a photoelectric conversion substrate that absorbs light incident from the light-receiving surface side and generates light carriers (electrons and holes).

By using crystalline silicon as the material for the semiconductor substrate 11, the dark current can be relatively small, and a relatively high output (output that is stable regardless of the illumination) can be obtained even when the intensity of the incident light is low.

The semiconductor substrate 11 may have a fine pyramidal uneven structure, known as a texture structure, on the back surface side. This increases the efficiency of collecting the light that has passed through without being absorbed by the semiconductor substrate 11.

The semiconductor substrate 11 may have a fine pyramidal uneven structure, known as a texture structure, on the light-receiving surface side. This reduces the reflection of light incident on the light-receiving surface and enhances the light trapping effect in the semiconductor substrate 11.

The third intrinsic semiconductor layer 13 is formed on the light-receiving surface side of the semiconductor substrate 11. The first intrinsic semiconductor layer 23 is formed in the first region 7 on the back surface side of the semiconductor substrate 11. The second intrinsic semiconductor layer 33 is formed in the second region 8 on the back surface side of the semiconductor substrate 11. The third intrinsic semiconductor layer 13, the first intrinsic semiconductor layer 23, and the second intrinsic semiconductor layer 33 are formed from a material consisting mainly of an intrinsic (i-type) amorphous silicon material. The third intrinsic semiconductor layer 13, the first intrinsic semiconductor layer 23, and the second intrinsic semiconductor layer 33 suppress recombination of carriers generated in the semiconductor substrate 11, whereby improving the efficiency of collecting the carriers.

The optical adjustment layer 15 is formed on the third intrinsic semiconductor layer 13 on the light-receiving surface side of the semiconductor substrate 11. The optical adjustment layer 15 functions as an anti-reflection layer to prevent reflection of the incident light, and also functions as a protective layer to protect the light-receiving surface side of the semiconductor substrate 11 and the third intrinsic semiconductor layer 13. The optical adjustment layer 15 is formed from materials such as silicon oxide (SiO), silicon nitride (SiN), silicon oxynitride (SiON), or their compounds.

The first conductivity-type semiconductor layer 25 is formed on the first intrinsic semiconductor layer 23, that is, in the first region 7 on the back surface side of the semiconductor substrate 11. On the other hand, the second conductivity-type semiconductor layer 35 is formed on the second intrinsic semiconductor layer 33, that is, in the second region 8 on the back surface side of the semiconductor substrate 11. In other words, the first conductivity-type semiconductor layer 25 and the first intrinsic semiconductor layer 23 (the first semiconductor layer) form a band shape and extend in the Y direction. Similarly, the second conductivity-type semiconductor layer 35 and the second intrinsic semiconductor layer 33 (the second semiconductor layer) form a band shape and extend in the Y direction. The first semiconductor layers 25, 23 and the second semiconductor layers 35, 33 are alternately arranged in the X direction. Some of the second semiconductor layers 35, 33 may or may not overlap some of the adjacent first semiconductor layers 25, 23 (not illustrated).

The first conductivity-type semiconductor layer 25 is formed, for example, from an amorphous silicon material. The first conductivity-type semiconductor layer 25 is a p-type semiconductor layer, for example, in which a p-type dopant (for instance, the aforementioned boron (B)) is doped into the amorphous silicon material.

The second conductivity-type semiconductor layer 35 is formed, for example, from an amorphous silicon material. The second conductivity-type semiconductor layer 35 is an n-type semiconductor layer, for example, in which an n-type dopant (for instance, the aforementioned phosphorus (P)) is doped into the amorphous silicon material. Note that the first conductivity-type semiconductor layer 25 may be an n-type semiconductor layer, and the second conductivity-type semiconductor layer 35 may be a p-type semiconductor layer.

As illustrated in FIG. 2, in the second region 8, the first semiconductor layers 25, 23 exist in some part between the semiconductor substrate 11 and the second semiconductor layers 35, 33. That is, in the second region 8, the first conductivity-type semiconductor layer 25 (and the first intrinsic semiconductor layer 23) exists in some part between the semiconductor substrate 11 and the second conductivity-type semiconductor layer 35 (and the second intrinsic semiconductor layer 33).

Figure 3:
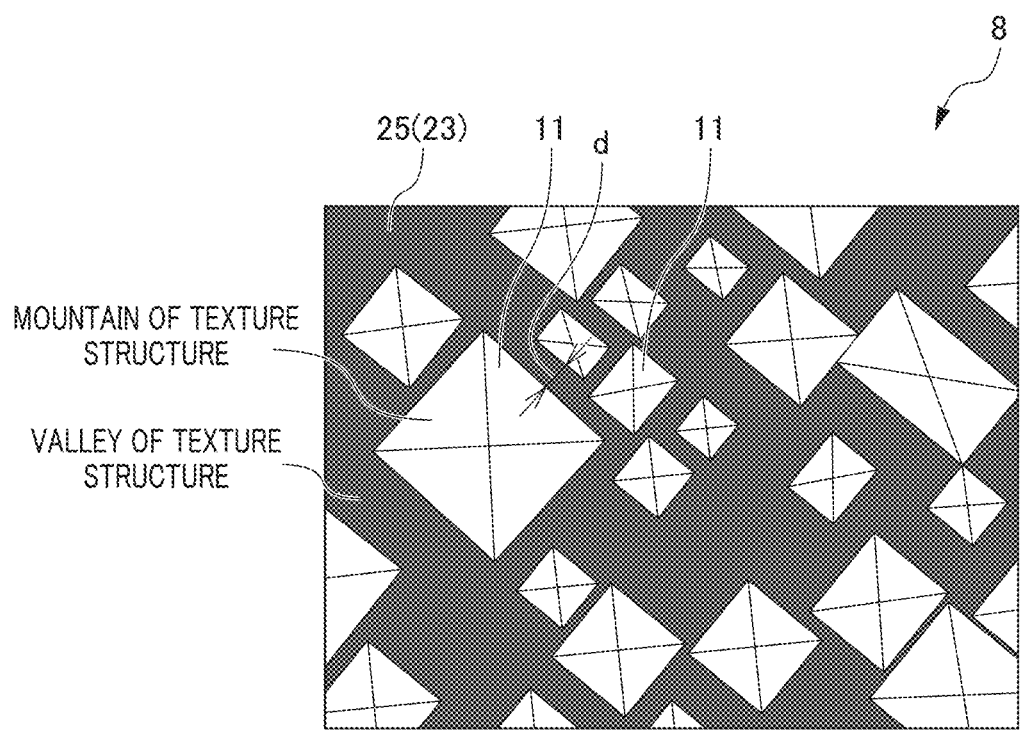
FIG. 3 is a view of the solar cell illustrated in FIGS. 1 and 2 as viewed from the back surface side, and is an enlarged view illustrating an example of the arrangement of a first semiconductor layer in a second region.

FIG. 3 is a view of the solar cell illustrated in FIGS. 1 and 2 as viewed from the back surface side, and is an enlarged view illustrating an example of the arrangement of the first semiconductor layer in the second region. Note that FIG. 3 illustrates the state after patterning the first semiconductor layer and before forming the second semiconductor layer.

As illustrated in FIG. 3, in the second region 8, the first semiconductor layers 25, 23, namely the first conductivity-type semiconductor layer 25 and the first intrinsic semiconductor layer 23, may exist in a sea shape (in other words, continuously) in the sea-island structure. Alternatively, in the second region 8, the first semiconductor layers 25, 23, namely the first conductivity-type semiconductor layer 25 and the first intrinsic semiconductor layer 23, may exist in an island shape (in other words, discontinuously) in the sea-island structure.

More specifically, in the second region 8, the first semiconductor layers 25, 23, namely the first conductivity-type semiconductor layer 25 and the first intrinsic semiconductor layer 23, exist at least in some part of the valley of the texture structure of the semiconductor substrate 11.

As illustrated in FIG. 2, the film thickness of the first semiconductor layers 25, 23 (namely the first conductivity-type semiconductor layer 25 and the first intrinsic semiconductor layer 23) in the second region 8 is thinner than the film thickness of the first semiconductor layers 25, 23 (namely the first conductivity-type semiconductor layer 25 and the first intrinsic semiconductor layer 23) in the first region 7. In particular, the film thickness of the first conductivity-type semiconductor layer 25 in the second region 8 is thinner than the film thickness of the first conductivity-type semiconductor layer 25 in the first region 7. In this case, the film thickness of the first intrinsic semiconductor layer 23 under the first conductivity-type semiconductor layer 25 in the second region 8 is the same as the film thickness of the first intrinsic semiconductor layer 23 under the first conductivity-type semiconductor layer 25 in the first region 7.

Note that, in the second region 8, all of the first conductivity-type semiconductor layer 25 may be etched, and only the first intrinsic semiconductor layer 23 may remain at least in some part of the valley of the texture structure of the semiconductor substrate 11. In this case, the film thickness of the first intrinsic semiconductor layer 23 remaining in the second region 8 becomes thinner than the film thickness of the first intrinsic semiconductor layer 23 in the first region 7.

If the second semiconductor layers 35, 33 collect minority carriers generated in the semiconductor substrate 11, the continuous distance d of the first semiconductor layers 25, 23 formed in the second region 8 is no more than half of the diffusion length L calculated from the lifetime t of the minority carriers generated in the semiconductor substrate 11.

$$d<L/2$$

$$L=(D\tau)^{1/2}$$

D is the diffusion coefficient of the carriers.

In this manner, the gap of the second semiconductor layers 35, 33, which contact the semiconductor substrate 11 without going through the first semiconductor layers 25, 23, can be no more than half of the diffusion length L calculated from the lifetime τ of the minority carriers, which allows the second semiconductor layers 35, 33 to easily collect minority carriers. This will be described in detail below.

When light enters the solar cell 1, electrons and holes (carriers) are generated in the semiconductor substrate 11. Electrons are attracted to the n-type semiconductor layer, and holes are attracted to the p-type semiconductor layer. If the semiconductor substrate 11 is an n-type substrate, holes will be minority carriers; and if the semiconductor substrate 11 is a p-type substrate, electrons will be minority carriers.

For example, consider the case where the semiconductor substrate 11 is an n-type substrate, the first conductivity-type semiconductor layer 25 is an n-type semiconductor layer, the second conductivity-type semiconductor layer 35 is a p-type semiconductor layer, and the plurality of n-type semiconductor layers 25 are formed in a sea shape in the second region 8 where the p-type semiconductor layer 35 has been formed. In this case, in order to suppress recombination of electrons and holes (carriers) generated in the n-type substrate and efficiently extract the holes of the minority carriers generated in the n-type substrate from the p-type semiconductor layer 35, the continuous distance d (for instance, the shorter of the pattern's length or width) of the n-type semiconductor layer 25 in the second region 8 needs to be no more than half of the diffusion length L calculated from the lifetime of the holes of the minority carriers.

In general, the distance between the peaks of the texture structure is 0.5 μm to 10 μm. Therefore, in the present embodiment, the continuous distance d of the first semiconductor layers 25, 23 in the second region 8 is no more than half of the diffusion length L calculated from the lifetime τ of the minority carriers generated in the semiconductor substrate 11.

The first electrode layer 27 is formed on the first conductivity-type semiconductor layer that is, in the first region 7 on the back surface side of the semiconductor substrate 11. On the other hand, the second electrode layer 37 is formed on the second conductivity-type semiconductor layer 35, that is, in the second region 8 on the back surface side of the semiconductor substrate 11. That is, the first electrode layer 27 and the second electrode layer 37 form a band shape and extend in the Y direction. The first electrode layer 27 and the second electrode layer 37 are alternately provided in the X direction.

The first electrode layer 27 may be composed of a transparent electrode layer and a metal electrode layer, or may be composed only of a metal electrode layer. Similarly, the second electrode layer 37 may be composed of a transparent electrode layer and a metal electrode layer, or may be composed only of a metal electrode layer.

The transparent electrode layer is formed of a transparent conductive material. Examples of transparent conductive materials include ITO (Indium Tin Oxide: a composite oxide of indium oxide and tin oxide), ZnO(Zinc Oxide), etc. The metal electrode layer is formed of a conductive paste material containing metal powder such as silver.

(Method of Manufacturing Solar Cell)

Figure 4A:
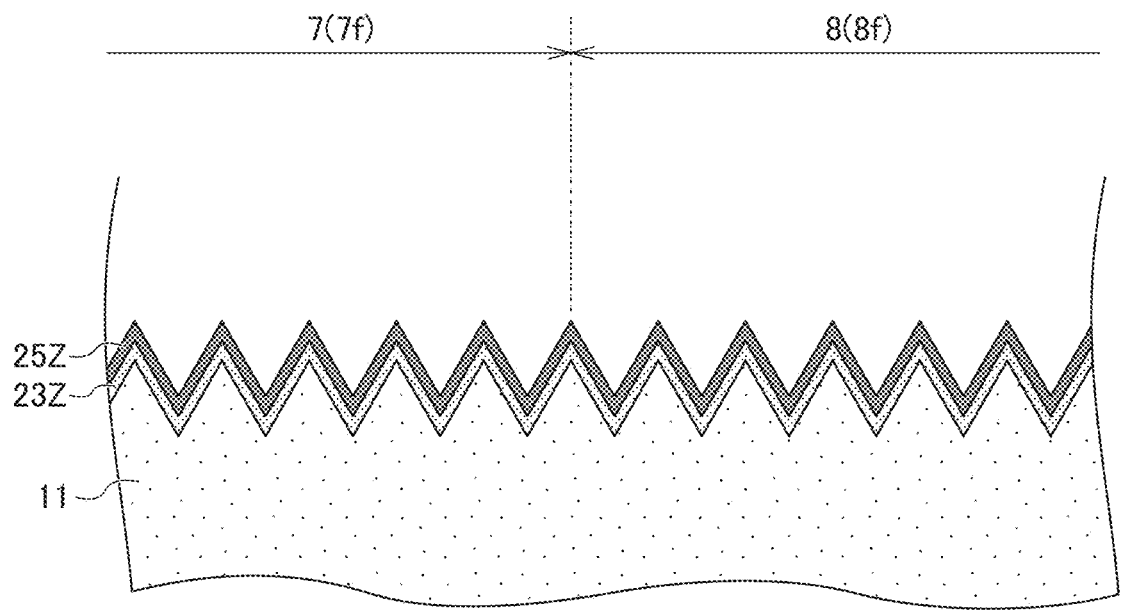
FIG. 4A is a diagram illustrating a first semiconductor layer material film forming step in the method of manufacturing a solar cell according to the present embodiment.
Figure 4B:
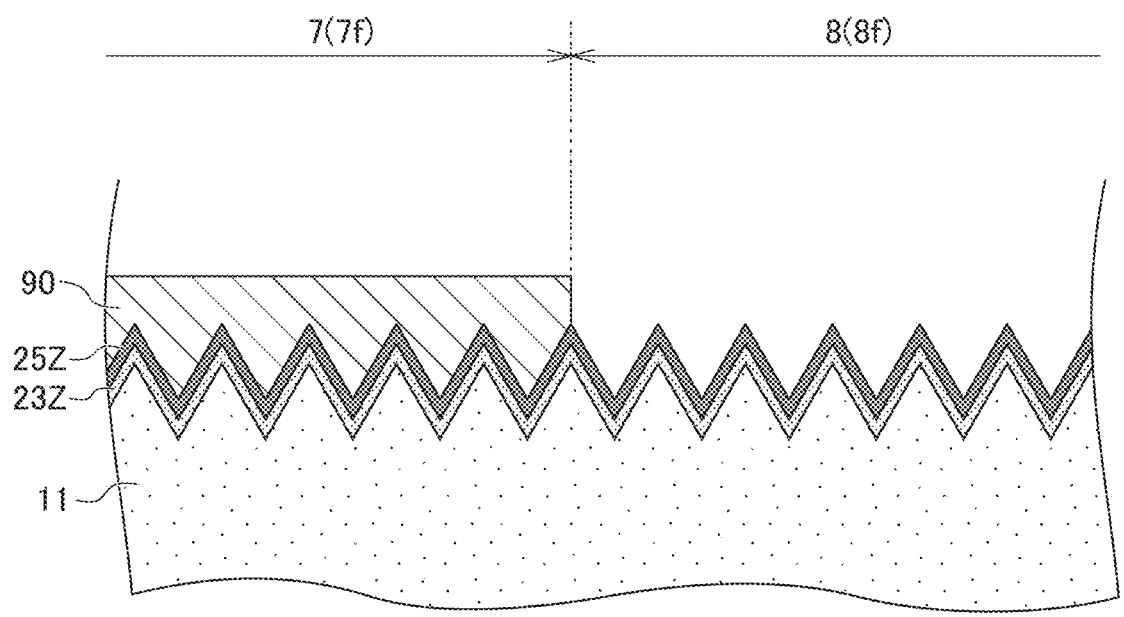
FIG. 4B is a diagram illustrating a first semiconductor layer forming step in the method of manufacturing a solar cell according to the present embodiment.
Figure 4C:
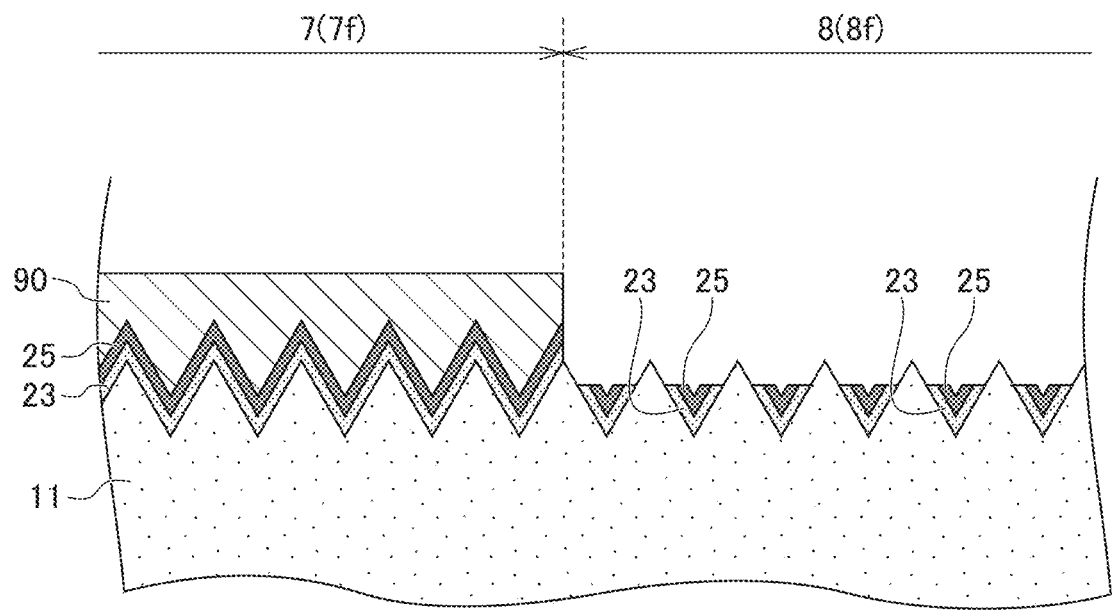
FIG. 4C is a diagram illustrating the first semiconductor layer forming step in the method of manufacturing a solar cell according to the present embodiment.
Figure 4D:
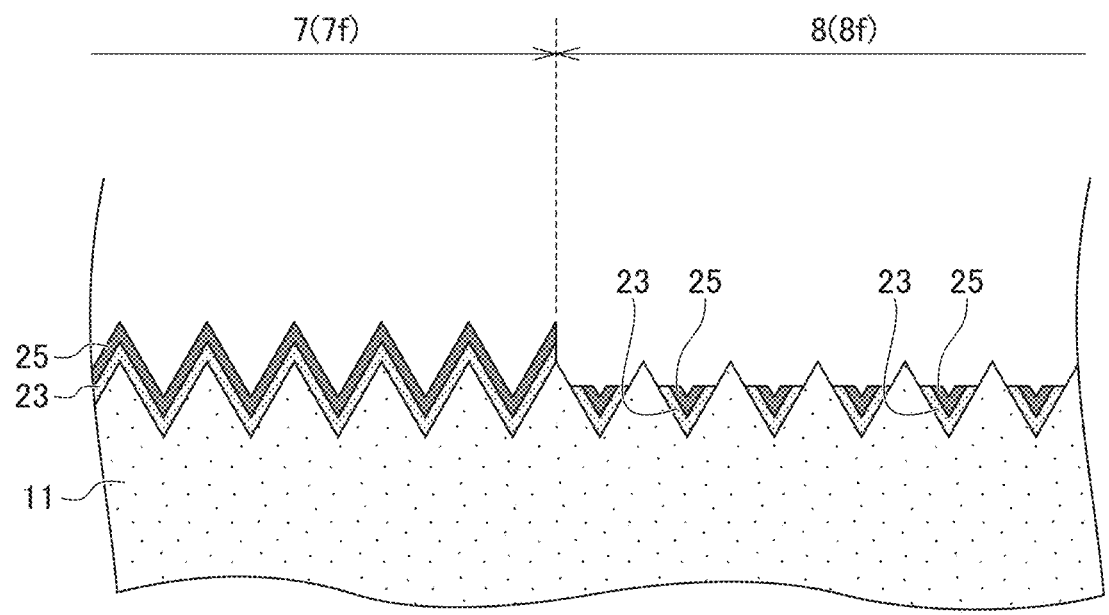
FIG. 4D is a diagram illustrating the first semiconductor layer forming step in the method of manufacturing a solar cell according to the present embodiment.
Figure 4E:
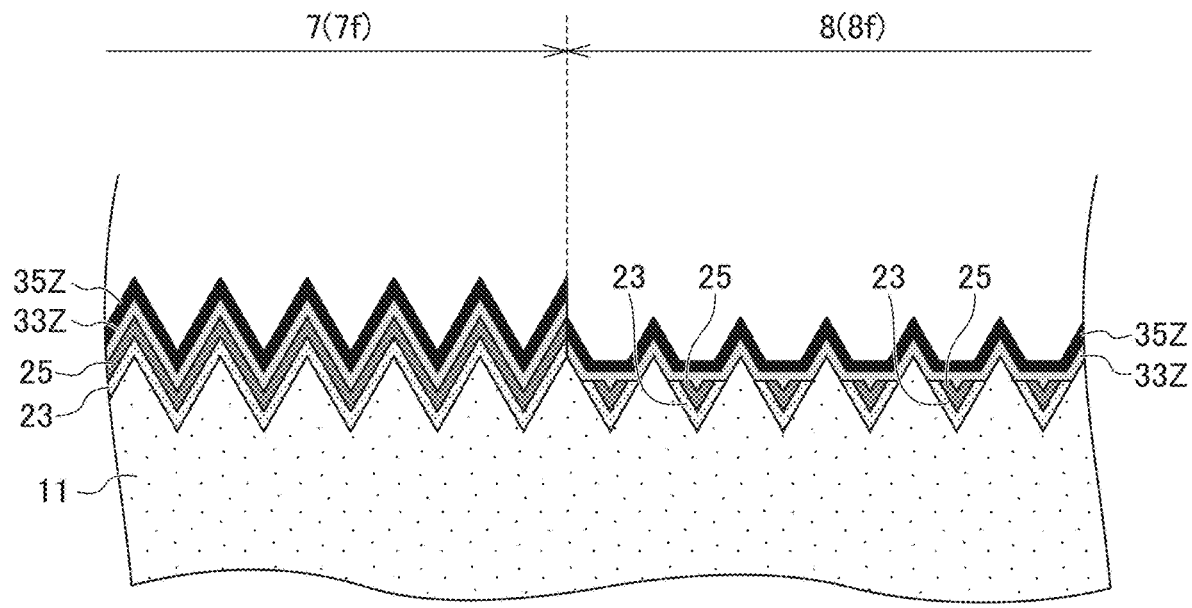
FIG. 4E is a diagram illustrating a second semiconductor layer material film forming step in the method of manufacturing a solar cell according to the present embodiment.
Figure 4F:
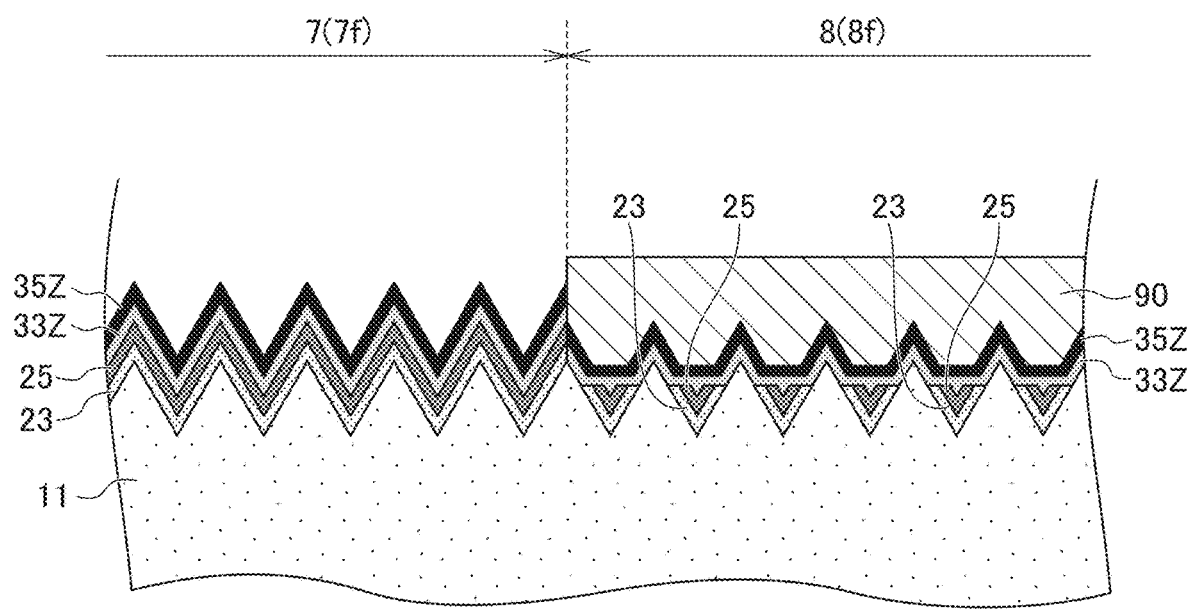
FIG. 4F is a diagram illustrating a second semiconductor layer forming step in the method of manufacturing a solar cell according to the present embodiment.
Figure 4G:
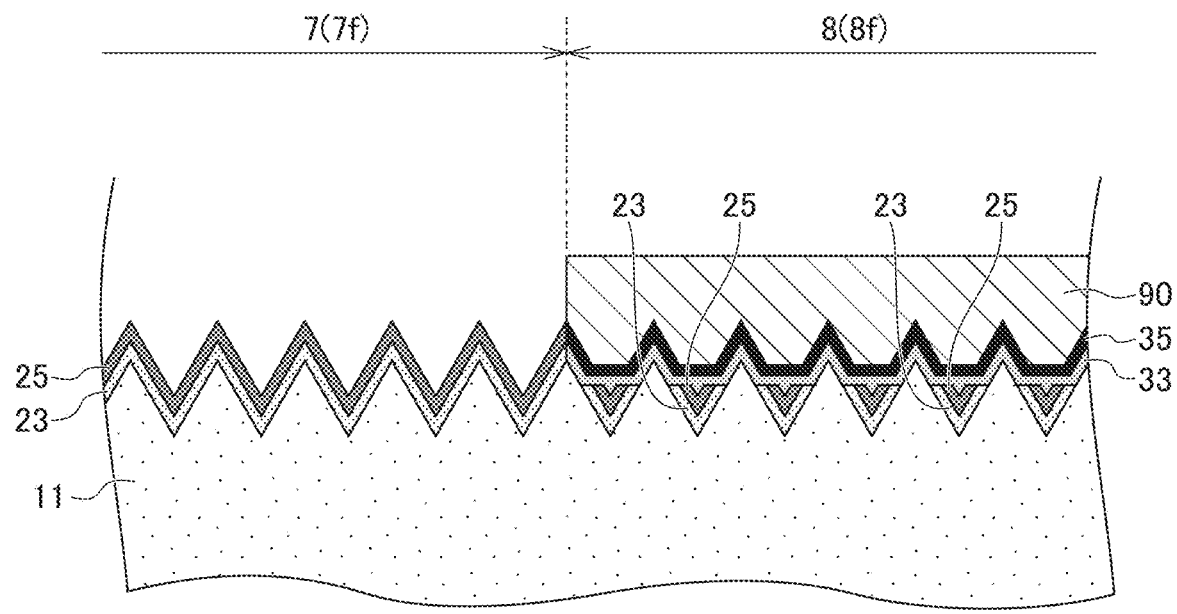
FIG. 4G is a diagram illustrating the second semiconductor layer forming step in the method of manufacturing a solar cell according to the present embodiment.
Figure 4H:
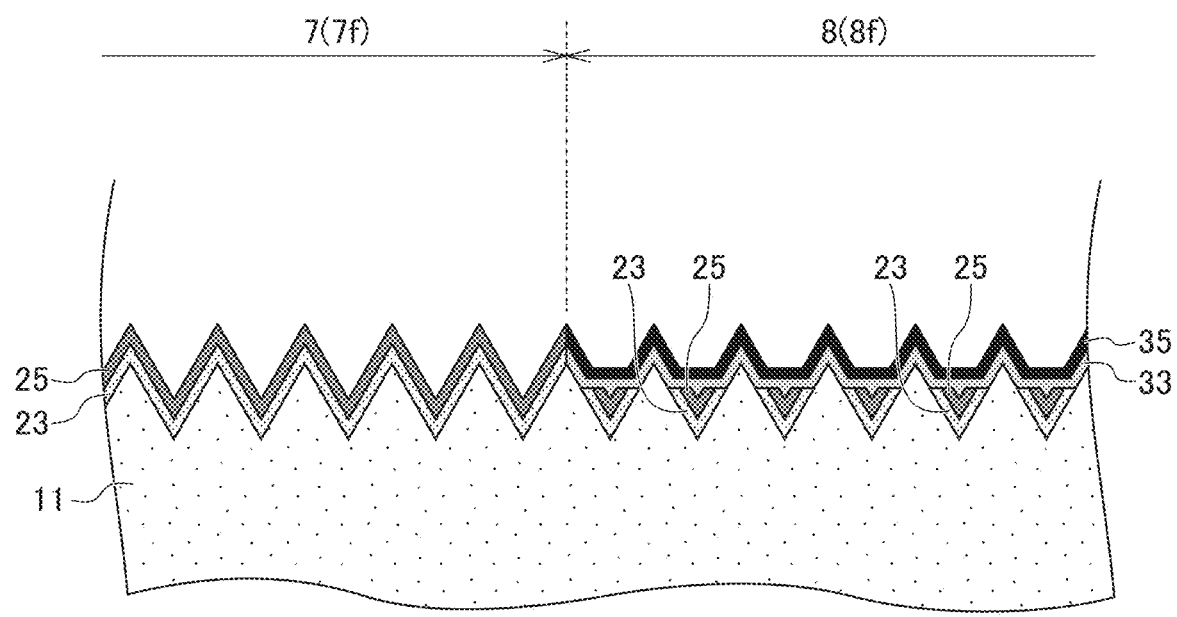
FIG. 4H is a diagram illustrating the second semiconductor layer forming step in the method of manufacturing a solar cell according to the present embodiment.

Next, referring to FIGS. 4A to 4H, an example of a method of manufacturing a solar cell according to the present embodiment is described. FIG. 4A is a diagram illustrating a first semiconductor layer material film forming step in the method of manufacturing a solar cell according to the present embodiment; and FIGS. 4B to 4D are diagrams illustrating a first semiconductor layer forming step in the method of manufacturing a solar cell according to the present embodiment. FIG. 4E is a diagram illustrating a second semiconductor layer material film forming step in the method of manufacturing a solar cell according to the present embodiment; and FIGS. 4F to 4H are diagrams illustrating a second semiconductor layer forming step in the method of manufacturing a solar cell according to the present embodiment. FIGS. 4A to 4H illustrate the back surface side of the semiconductor substrate 11, and omit the light-receiving surface side of the semiconductor substrate 11.

First, as illustrated in FIG. 4A, for example, using a CVD method (Chemical Vapor Deposition method) or a PVD method (Physical Vapor Deposition method), a first intrinsic semiconductor layer material film 23Z and a first conductivity-type semiconductor layer material film 25Z (the first semiconductor layer material film) are formed in sequence on the entire surface on the back surface side of the semiconductor substrate 11 (first semiconductor layer material film forming step).

At this time, using a CVD method or a PVD method, for example, a third intrinsic semiconductor layer 13 may be formed on the entire surface on the light-receiving surface side of the semiconductor substrate 11 (not illustrated).

Next, as illustrated in FIGS. 4B to 4D, using a resist, the first intrinsic semiconductor layer material film 23Z and the first conductivity-type semiconductor layer material film 25Z (first semiconductor layer material film) in the second region 8 on the back surface side of the semiconductor substrate 11 are removed, to form a first intrinsic semiconductor layer 23 and a first conductivity-type semiconductor layer 25 (first semiconductor layer) thus patterned in the first region 7 (first semiconductor layer forming step).

Specifically, as illustrated in FIG. 4B, a resist (first resist) 90 is formed on the first region 7 on the back surface side of the semiconductor substrate 11 (and on the entire surface on the light-receiving surface side of the semiconductor substrate 11) (first resist forming step). The resist 90 can be formed using photolithography technology or printing technology.

Thereafter, as illustrated in FIG. 4C, using the resist 90 as a mask, the first conductivity-type semiconductor layer material film 25Z and the first intrinsic semiconductor layer material film 23Z (first semiconductor layer material film) in the second region 8 are etched, to form a first intrinsic semiconductor layer 23 and a first conductivity-type semiconductor layer 25 (first semiconductor layer) thus patterned in the first region 7 (first semiconductor layer forming step).

At this time, when etching in the second region 8, the first semiconductor layers 25, 23, namely the first conductivity-type semiconductor layer 25 and the first intrinsic semiconductor layer 23, are left on the semiconductor substrate 11 in a sea shape (in other words, continuously) or an island shape (in other words, discontinuously) in the sea-island structure, for example, by adjusting the etching time (see FIG. 3). More specifically, in the second region 8, the first semiconductor layers 25, 23, namely the first conductivity-type semiconductor layer 25 and the first intrinsic semiconductor layer 23, remain at least in some part of the valley of the texture structure of the semiconductor substrate 11.

Note that in the second region 8, part of the first semiconductor layers 25, 23, namely the first conductivity-type semiconductor layer 25 and the first intrinsic semiconductor layer 23, especially the first conductivity-type semiconductor layer 25, is etched. Therefore, the film thickness of the first semiconductor layers 25, 23 (namely the first conductivity-type semiconductor layer 25 and the first intrinsic semiconductor layer 23) in the second region 8 becomes thinner than the film thickness of the first semiconductor layers 25, 23 (namely the first conductivity-type semiconductor layer 25 and the first intrinsic semiconductor layer 23) in the first region 7. In particular, the film thickness of the first conductivity-type semiconductor layer 25 in the second region 8 becomes thinner than the film thickness of the first conductivity-type semiconductor layer 25 in the first region 7. In this case, the film thickness of the first intrinsic semiconductor layer 23 under the first conductivity-type semiconductor layer 25 in the second region 8 is the same as the film thickness of the first intrinsic semiconductor layer 23 under the first conductivity-type semiconductor layer 25 in the first region 7.

In the second region 8, all of the first conductivity-type semiconductor layer 25 may be etched, and only the first intrinsic semiconductor layer 23 may remain at least in some part of the valley of the texture structure of the semiconductor substrate 11. In this case, the film thickness of the first intrinsic semiconductor layer 23 remaining in the second region 8 becomes thinner than the film thickness of the first intrinsic semiconductor layer 23 in the first region 7.

In this manner, since there is no need to completely remove the first semiconductor layers 25, 23, the time for the patterning process of the first semiconductor layers 25, 23 can be shortened, which can simplify the manufacturing process of the solar cell.

As an etching solution for the p-type semiconductor layer material film, an acidic solution such as a mixture solution in which ozone is dissolved in hydrofluoric acid, or a mixture solution of hydrofluoric acid and nitric acid, can be mentioned; and as an etching solution for the n-type semiconductor layer material film, an alkaline solution such as a potassium hydroxide aqueous solution can be mentioned.

Thereafter, as illustrated in FIG. 4D, the resist 90 is removed (first resist removing step). An organic solvent such as acetone can be used as an etching solution for the resist 90.

Next, both sides of the semiconductor substrate 11 are cleaned (first cleaning step). In the first cleaning step, for instance, an ozone treatment is performed followed by a hydrofluoric acid treatment. The term "hydrofluoric acid treatment" includes not only a treatment with hydrofluoric acid but also treatments with a mixture containing other types of acids (for instance, hydrochloric acid in the first cleaning step).

The inventors of the present application have found that in this cleaning step, exposure of the back surface of the semiconductor substrate 11 in the second region 8 to the cleaning solution is the factor that lowers the lifetime of the carriers in the semiconductor substrate 11. In particular, it is anticipated that the cleaning solution remains in the valley of the texture structure of the semiconductor substrate 11, resulting in excessive etching.

In this regard, in the present embodiment, by suppressing the exposure of the back surface of the semiconductor substrate 11 during the patterning process of the first semiconductor layers 25, 23, the lifetime of the carriers in the semiconductor substrate 11 improves. In particular, by leaving the first semiconductor layers 25, 23 in the valley of the texture structure of the semiconductor substrate 11, this valley of the texture structure becomes shallow. Therefore, it is conjectured that the cleaning solution is suppressed from remaining in the valley of the texture structure of the semiconductor substrate 11, and excessive etching is also suppressed.

Next, as illustrated in FIG. 4E, for example, using a CVD method or a PVD method, a second intrinsic semiconductor layer material film 33Z and a second conductivity-type semiconductor layer material film 35Z (second semiconductor layer material film) are formed in sequence on the entire surface on the back surface side of the semiconductor substrate 11 (second semiconductor layer material film forming step).

Next, as illustrated in FIGS. 4F to 4H, by using a resist, the second intrinsic semiconductor layer material film 33Z and the second conductivity-type semiconductor layer material film 35Z (second semiconductor layer material film) in the first region 7 are removed from the back surface side of the semiconductor substrate 11, to form a second intrinsic semiconductor layer 33 and a second conductivity-type semiconductor layer 35 (second semiconductor layer) thus patterned in the second region 8 (second semiconductor layer forming step).

Specifically, as illustrated in FIG. 4F, a resist (second resist) 90 is formed on the second region 8 on the back surface side of the semiconductor substrate 11 (and the entire surface on the light-receiving surface side of the semiconductor substrate 11) (second resist forming step). The resist 90 can be formed using photolithography technology or printing technology.

Thereafter, as illustrated in FIG. 4G, by using the resist 90 as a mask, the second conductivity-type semiconductor layer material film 35Z and the second intrinsic semiconductor layer material film 33Z (second semiconductor layer material film) in the first region 7 are etched, to form a second intrinsic semiconductor layer 33 and a second conductivity-type semiconductor layer 35 (second semiconductor layer) thus patterned in the second region 8 (second semiconductor layer forming step).

Thereafter, as illustrated in FIG. 4H, the resist 90 is removed (second resist removing step). An organic solvent such as acetone can be used as an etching solution for the resist 90.

Thereafter, an optical adjustment layer 15 is formed on the entire surface on the light-receiving surface side of the semiconductor substrate 11 (not illustrated). A first electrode layer 27 and a second electrode layer 37 are formed on the back surface side of the semiconductor substrate 11 (not illustrated). Through the above steps, the back-junction solar cell 1 of the present embodiment as illustrated in FIGS. 1 to 3 is completed.

As described above, according to the method of manufacturing a solar cell of the present embodiment, and the solar cell 1 of the present embodiment, the first semiconductor layers 25, 23 remain in some part of the second region 8 of the semiconductor substrate 11 during the patterning process of the first semiconductor layers 25, 23, which can suppress the exposure of the back surface of the semiconductor substrate 11. This can improve the lifetime of the carriers in the semiconductor substrate 11, and as a result, the performance of the solar cell 1 can be improved.

In particular, by leaving the first semiconductor layers 25, 23 in the valley of the texture structure in the second region 8 of the semiconductor substrate 11, this valley becomes shallow. Therefore, during the substrate cleaning process after the patterning process of the first semiconductor layers 25, 23, it is conjectured that the cleaning solution is suppressed from remaining in the valley of the texture structure of the semiconductor substrate 11, and excessive etching is also suppressed. This can improve the lifetime of the carriers in the semiconductor substrate 11, and as a result, the performance of the solar cell 1 can be improved.

Furthermore, according to the method of manufacturing a solar cell of the present embodiment, and the solar cell 1 of the present embodiment, since there is no need to completely remove the first semiconductor layers 25, 23, the time for the patterning process of the first semiconductor layers 25, 23 can be shortened, which can simplify the manufacturing process of the solar cell. As a result, the productivity of solar cells can be improved.

Modification Example 1

In the above-mentioned embodiment, as illustrated in FIG. 4B, when patterning the first semiconductor layers 25, 23 (first patterning: first semiconductor layer forming step), the resist (first resist) 90 is formed only in the first region 7 on the back surface side of the semiconductor substrate 11 (first resist forming step). In Modification Example 1, during the patterning of the first semiconductor layers 25, 23 (first patterning: first semiconductor layer forming step), a resist may also be formed locally in the valley of the texture structure in the second region 8 on the back surface side of the semiconductor substrate 11.

Hereafter, referring to FIGS. 5A to 5D, an example of a method of manufacturing a solar cell according to Modification Example 1 of the present embodiment will be described. FIGS. 5A to 5D are diagrams illustrating the first semiconductor layer forming step in the method of manufacturing a solar cell according to Modification Example 1 of the present embodiment. The first semiconductor layer material film forming step, the second semiconductor layer material film forming step, and the second semiconductor layer forming step are the same as those in the above-described embodiment, so the descriptions are omitted. FIGS. 5A to 5D illustrate the back surface side of the semiconductor substrate 11, and omit the light-receiving surface side of the semiconductor substrate 11.

Figure 5A:
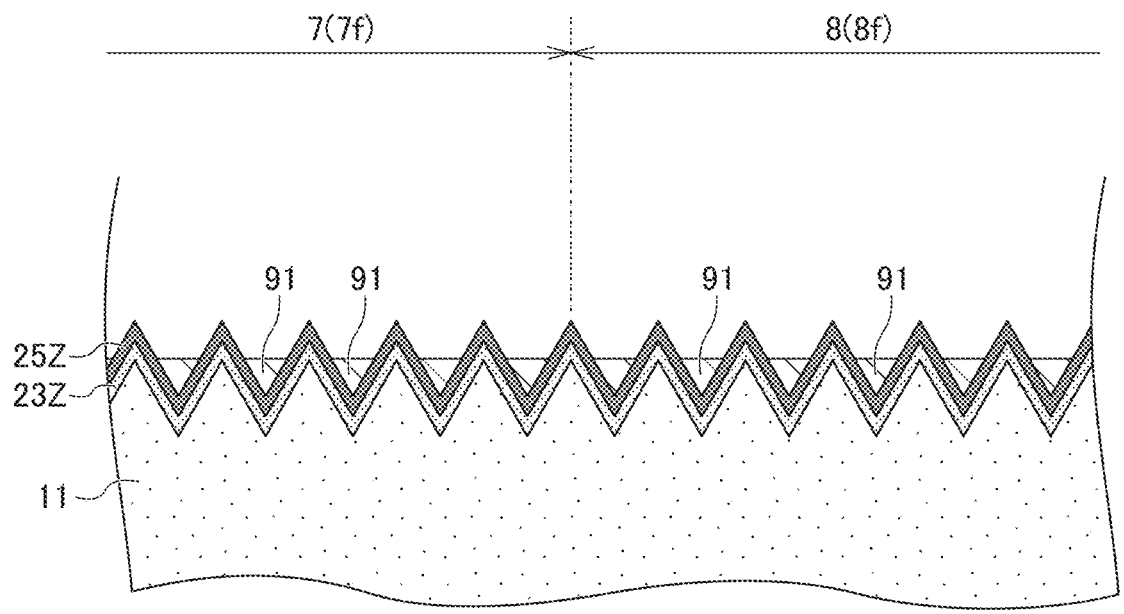
FIG. 5A is a diagram illustrating the first semiconductor layer forming step in the method of manufacturing a solar cell according to Modification Example 1 of the present embodiment.
Figure 5B:
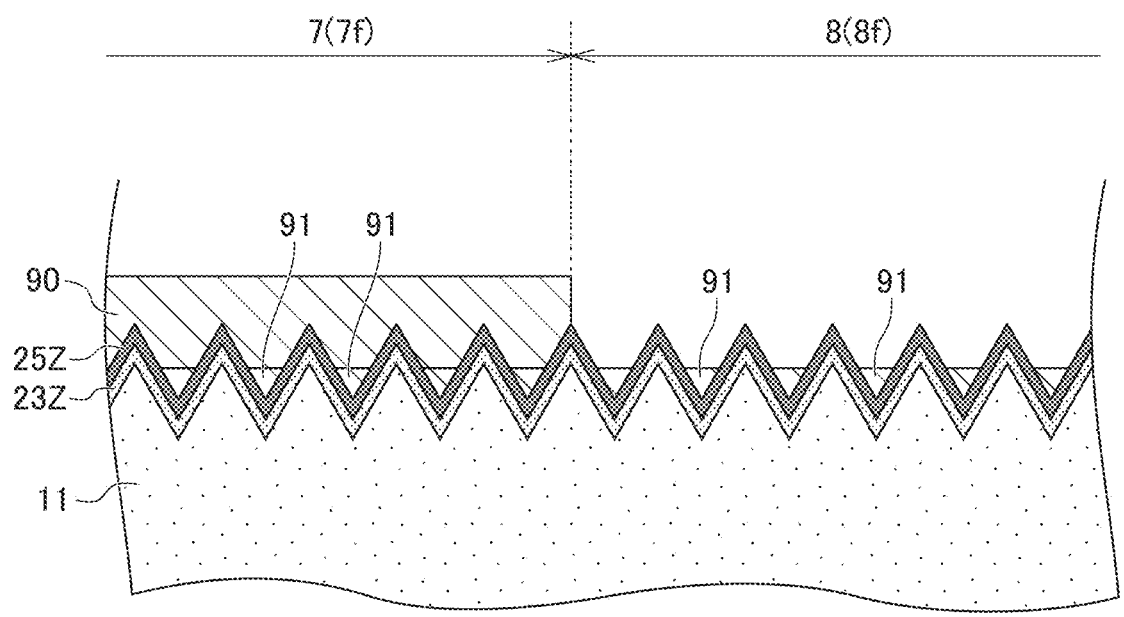
FIG. 5B is a diagram illustrating the first semiconductor layer forming step in the method of manufacturing a solar cell according to Modification Example 1 of the present embodiment.

As illustrated in FIG. 5A, a local resist 91 is formed only in the valley of the texture structure on the back surface side of the semiconductor substrate 11, in other words, such that the top of the texture structure is exposed. Thereafter, as illustrated in FIG. 5B, a resist (first resist) 90 is formed in the first region 7 on the back surface side of the semiconductor substrate 11, as described above (first resist forming step). The method of forming the local resist 91 is not limited in particular, but for example, a spin coating method can be mentioned. The material of the local resist 91 may be the same as or different from the resist 90.

Figure 5C:
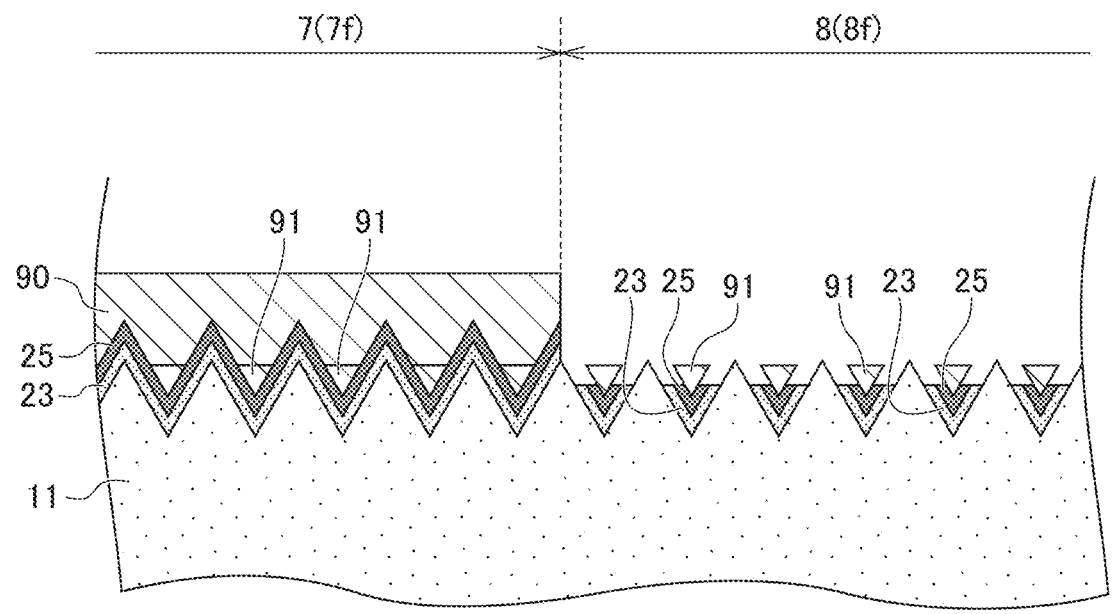
FIG. 5C is a diagram illustrating the first semiconductor layer forming step in the method of manufacturing a solar cell according to Modification Example 1 of the present embodiment.

Thereafter, as illustrated in FIG. 5C, in the same manner as described above, by using the resist 90 as a mask, the first conductivity-type semiconductor layer material film 25Z and the first intrinsic semiconductor layer material film 23Z (first semiconductor layer material film) in the second region 8 are etched, to form a first intrinsic semiconductor layer 23 and a first conductivity-type semiconductor layer 25 (first semiconductor layer) thus patterned in the first region 7 (first semiconductor layer forming step).

At this time, when etching in the second region 8, using the local resist 91 as a mask, the first semiconductor layers 25, 23, namely the first conductivity-type semiconductor layer 25 and the first intrinsic semiconductor layer 23, are left on the semiconductor substrate 11 in a sea shape (in other words, continuously) in the sea-island structure or an island shape (in other words, discontinuously) in the sea-island structure (refer to FIG. 3). More specifically, in the second region 8, the first semiconductor layers 25, 23, namely the first conductivity-type semiconductor layer 25 and the first intrinsic semiconductor layer 23, remain at least in some part of the valley of the texture structure of the semiconductor substrate 11.

Figure 5D:
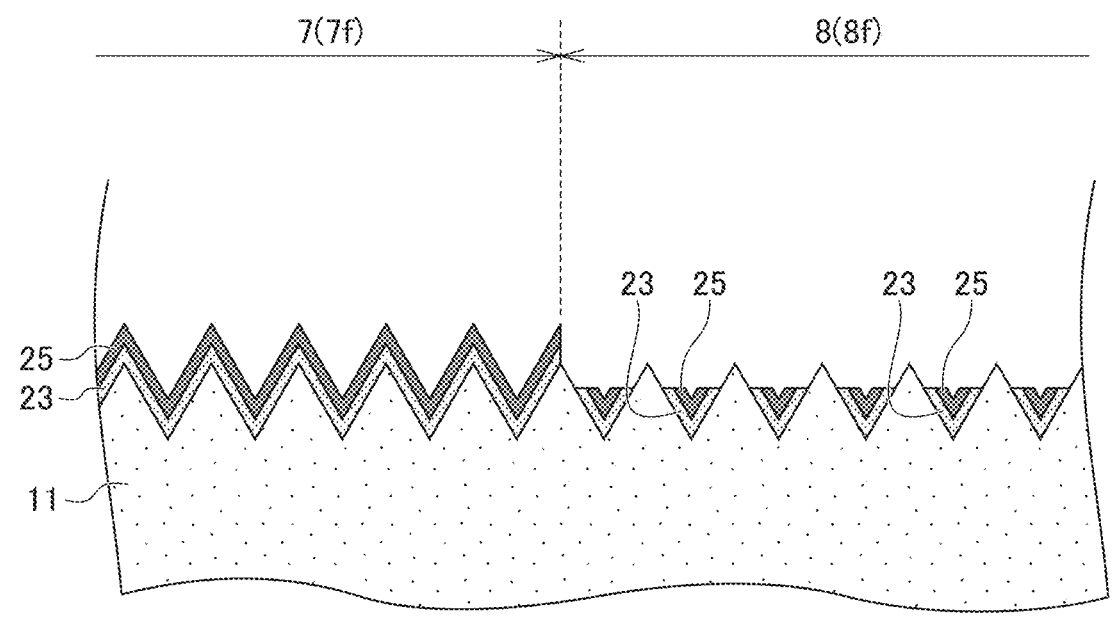
FIG. 5D is a diagram illustrating the first semiconductor layer forming step in the method of manufacturing a solar cell according to Modification Example 1 of the present embodiment.

Thereafter, as illustrated in FIG. 5D, the resist 90 and the local resist 91 are removed in the same manner as described above (first resist removing step).

Modification Example 2

In the above-mentioned embodiment, the patterning of the second semiconductor layers 35, 33 (second patterning: second semiconductor layer forming step) employed an etching method using the resist (second resist) 90, similar to the patterning of the first semiconductor layers 25, 23 (first patterning: first semiconductor layer forming step). In Modification Example 2, a lift-off method using a lift-off layer may be adopted in the patterning of the second semiconductor layers 35, 33 (second patterning: second semiconductor layer forming step).

Figure 6A:
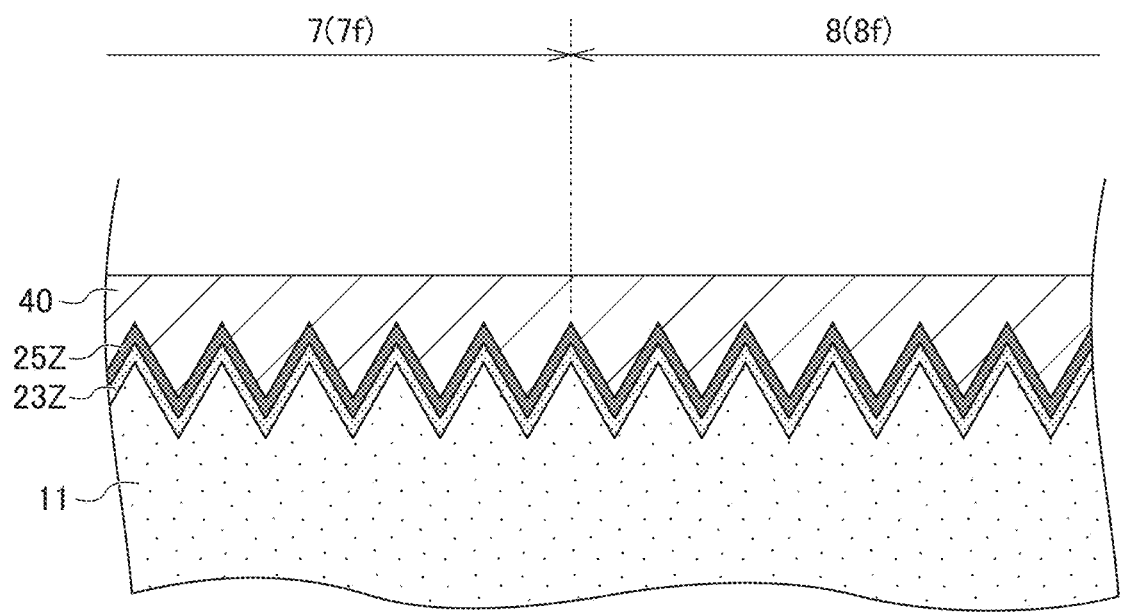
FIG. 6A is a diagram illustrating a first semiconductor layer material film forming step and a lift-off layer forming step in the method of manufacturing a solar cell according to Modification Example 2 of the present embodiment.
Figure 6B:
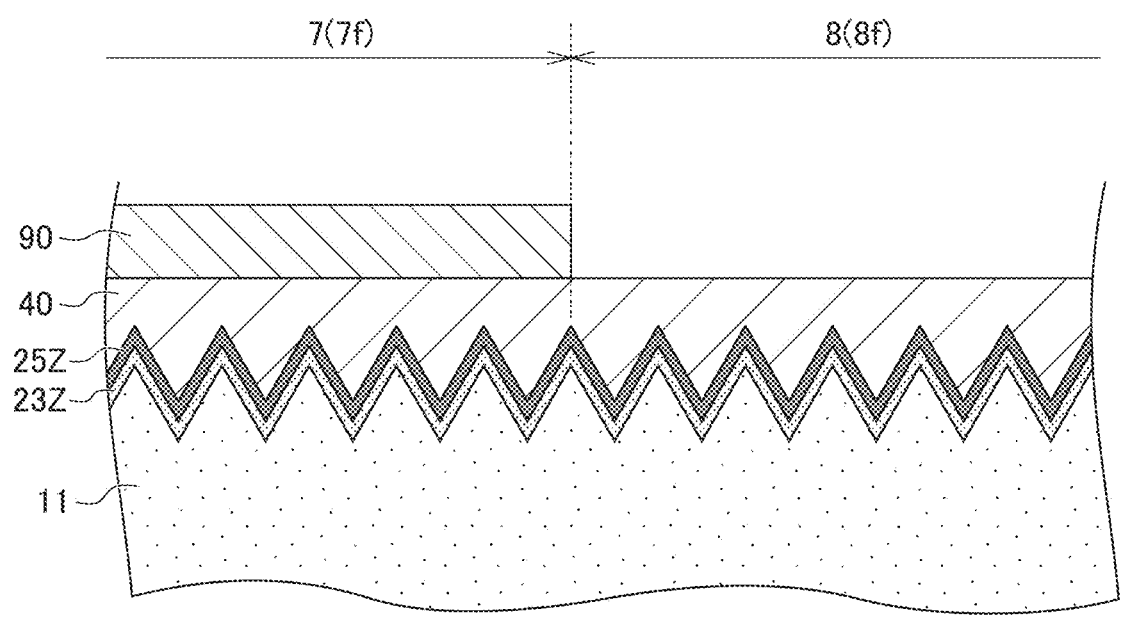
FIG. 6B is a diagram illustrating the first semiconductor layer forming step in the method of manufacturing a solar cell according to Modification Example 2 of the present embodiment.
Figure 6C:
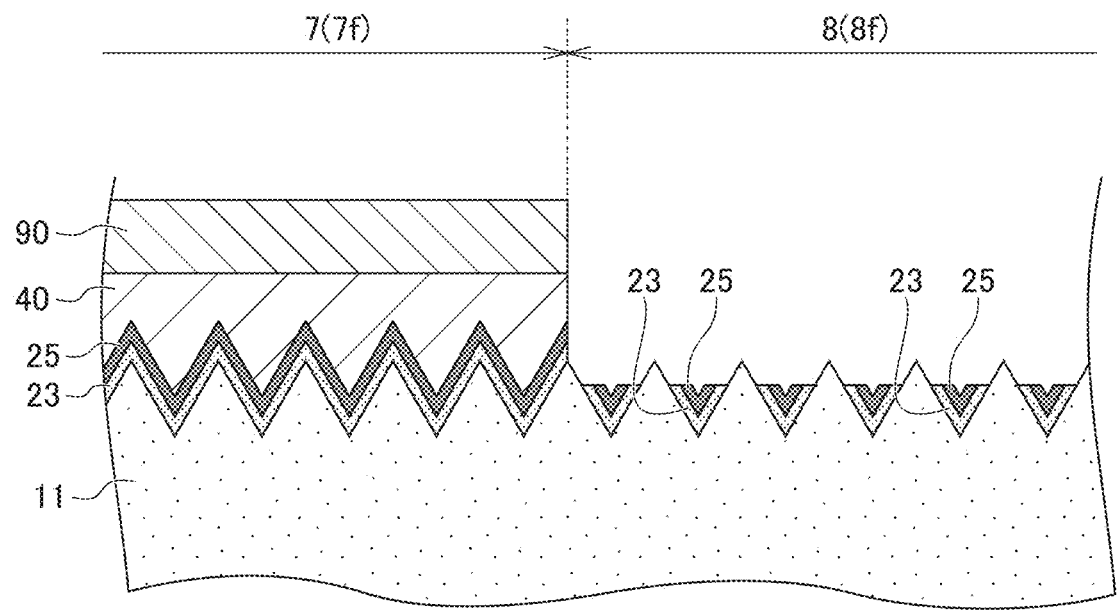
FIG. 6C is a diagram illustrating the first semiconductor layer forming step in the method of manufacturing a solar cell according to Modification Example 2 of the present embodiment.
Figure 6D:
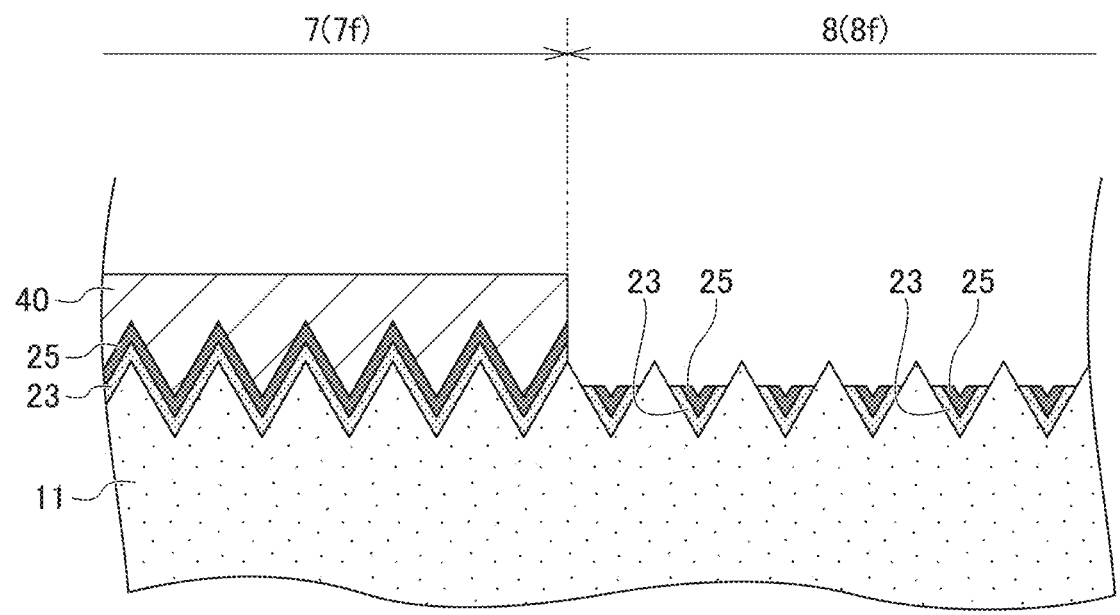
FIG. 6D is a diagram illustrating the first semiconductor layer forming step in the method of manufacturing a solar cell according to Modification Example 2 of the present embodiment.
Figure 6E:
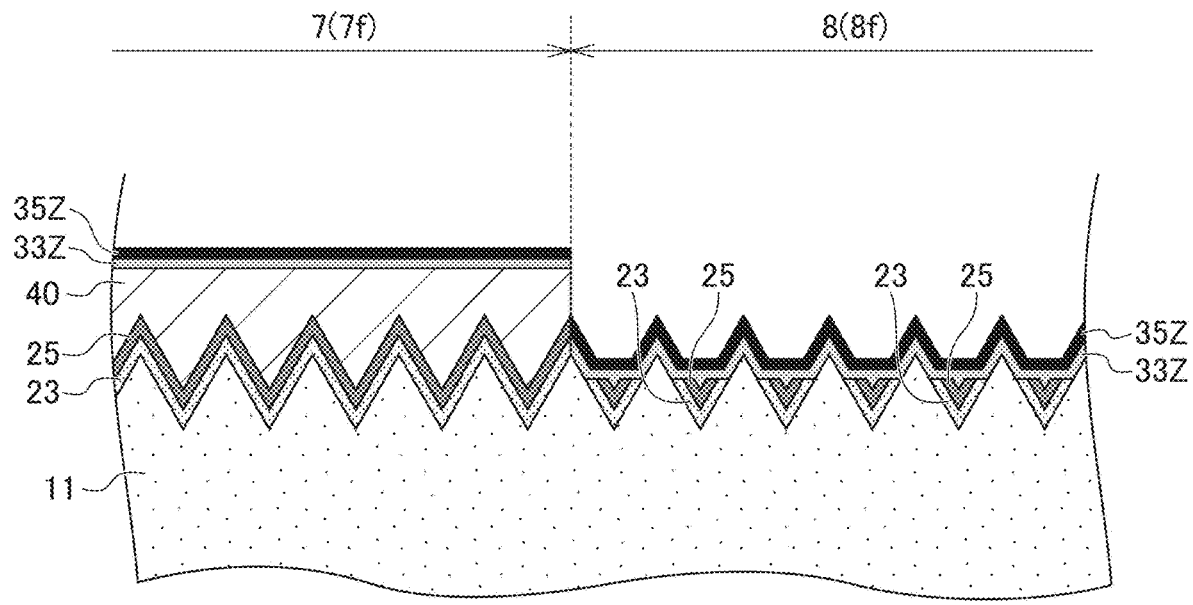
FIG. 6E is a diagram illustrating a second semiconductor layer material film forming step in the method of manufacturing a solar cell according to Modification Example 2 of the present embodiment.
Figure 6F:
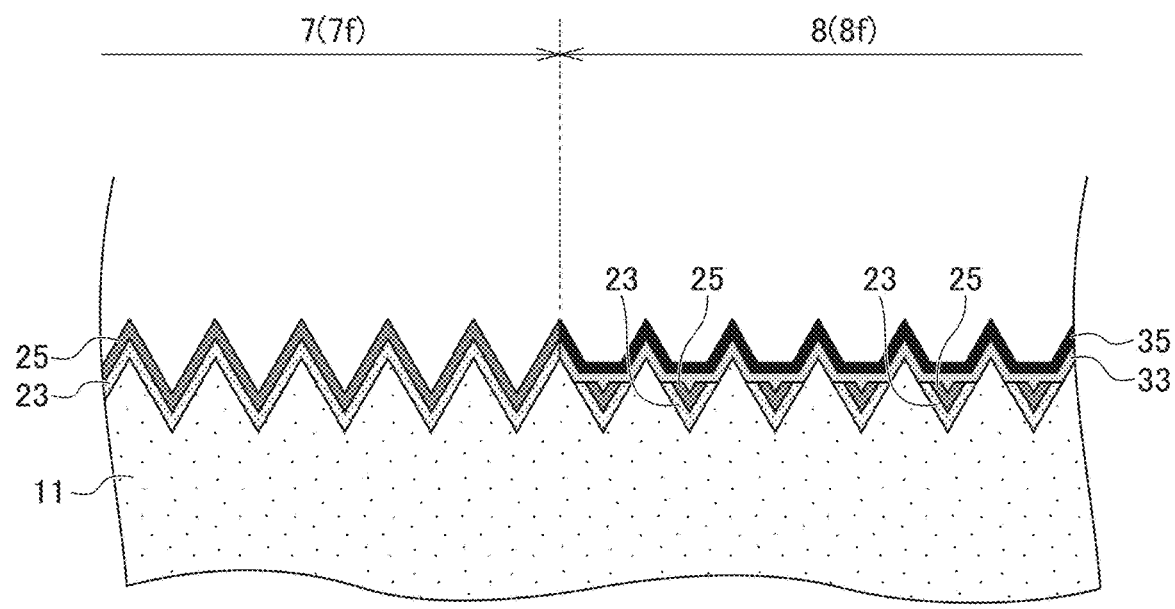
FIG. 6F is a diagram illustrating the second semiconductor layer forming step in the method of manufacturing a solar cell according to Modification Example 2 of the present embodiment.

Referring to FIGS. 6A to 6F, an example of a method of manufacturing a solar cell according to Modification Example 2 of the present embodiment will be described below. FIG. 6A is a diagram illustrating the first semiconductor layer material film forming step and the lift-off layer forming step in the method of manufacturing a solar cell according to Modification Example 2 of the present embodiment; and FIGS. 6B to 6D are diagrams illustrating the first semiconductor layer forming step in the method of manufacturing a solar cell according to Modification Example 2 of the present embodiment. FIG. 6E is a diagram illustrating the second semiconductor layer material film forming step in the method of manufacturing a solar cell according to Modification Example 2 of the present embodiment; and FIG. 6F is a diagram illustrating the second semiconductor layer forming step in the method of manufacturing a solar cell according to the present embodiment. FIGS. 6A to 6F illustrate the back surface side of the semiconductor substrate 11, and omit the light-receiving surface side of the semiconductor substrate 11.

First, as illustrated in FIG. 6A, similar to the above, for example, using a CVD method (Chemical Vapor Deposition method) or a PVD method (Physical Vapor Deposition method), the first intrinsic semiconductor layer material film 23Z and the first conductivity-type semiconductor layer material film 25Z (first semiconductor layer material film) are formed in sequence on the entire surface on the back surface side of the semiconductor substrate 11 (first semiconductor layer material film forming step).

At this time, similar to the above, for example, using a CVD method or a PVD method, the third intrinsic semiconductor layer 13 may be formed on the entire surface on the light-receiving surface side of the semiconductor substrate 11 (not illustrated).

Next, using a CVD method or a PVD method, for example, a lift-off layer (sacrificial layer) 40 is formed on the entire surface on the back surface side of the semiconductor substrate 11, specifically, on the entire surface of the first conductivity-type semiconductor layer material film 25Z (lift-off layer forming step). The lift-off layer 40 is formed from materials such as silicon oxide (SiO), silicon nitride (SiN), or silicon oxynitride (SiON), or compounds thereof.

Next, as illustrated in FIGS. 6B to 6D, similar to the above, using a resist, the first intrinsic semiconductor layer material film 23Z and the first conductivity-type semiconductor layer material film 25Z (first semiconductor layer material film) as well as the lift-off layer 40 in the second region 8 on the back surface side of the semiconductor substrate 11 are removed, to form the first intrinsic semiconductor layer 23 and the first conductivity-type semiconductor layer 25 (first semiconductor layer) as well as the lift-off layer 40 thus patterned in the first region 7 (first semiconductor layer forming step).

Specifically, as illustrated in FIG. 6B, a resist (first resist) 90 is formed in the first region 7 on the back surface side of the semiconductor substrate 11 (and on the entire surface on the light-receiving surface side of the semiconductor substrate 11) (first resist forming step). The resist 90 can be formed using photolithography technology or printing technology, as described above.

Thereafter, as illustrated in FIG. 6C, by using the resist 90 as a mask, the lift-off layer 40, the first conductivity-type semiconductor layer material film 25Z and the first intrinsic semiconductor layer material film 23Z (the first semiconductor layer material film) in the second region 8 are etched, to form the first intrinsic semiconductor layer 23, the first conductivity-type semiconductor layer 25 (the first semiconductor layer) as well as the lift-off layer 40 thus patterned in the first region 7 (first semiconductor layer forming step).

At this time, when etching in the second region 8, the first semiconductor layers 25, 23, namely the first conductivity-type semiconductor layer 25 and the first intrinsic semiconductor layer 23, are left on the semiconductor substrate 11 in a sea shape (in other words, continuously) in the sea-island structure or an island shape (in other words, discontinuously) in the sea-island structure, for example, by adjusting the etching time (refer to FIG. 3). More specifically, in the second region 8, the first semiconductor layers 25, 23, namely the first conductivity-type semiconductor layer 25 and the first intrinsic semiconductor layer 23, are left at least in some part of the valley of the texture structure of the semiconductor substrate 11.

Note that in the second region 8, part of the first semiconductor layers 25, 23, namely the first conductivity-type semiconductor layer 25 and the first intrinsic semiconductor layer 23, especially the first conductivity-type semiconductor layer 25, is etched. Therefore, the film thickness of the first semiconductor layers 25, 23 (namely the first conductivity-type semiconductor layer 25 and the first intrinsic semiconductor layer 23) in the second region 8 becomes thinner than the film thickness of the first semiconductor layers 25, 23 (namely the first conductivity-type semiconductor layer 25 and the first intrinsic semiconductor layer 23) in the first region 7. In particular, the film thickness of the first conductivity-type semiconductor layer 25 in the second region 8 becomes thinner than the film thickness of the first conductivity-type semiconductor layer 25 in the first region 7. In this case, the film thickness of the first intrinsic semiconductor layer 23 under the first conductivity-type semiconductor layer 25 in the second region 8 is the same as the film thickness of the first intrinsic semiconductor layer 23 under the first conductivity-type semiconductor layer 25 in the first region 7.

Note that in the second region 8, all of the first conductivity-type semiconductor layer 25 may be etched, and only the first intrinsic semiconductor layer 23 may be left at least in some part of the valley of the texture structure of the semiconductor substrate 11. In this case, the film thickness of the first intrinsic semiconductor layer 23 remaining in the second region 8 becomes thinner than the film thickness of the first intrinsic semiconductor layer 23 in the first region 7.

In this manner, since there is no need to completely remove the first semiconductor layers 25, 23, the time for the patterning process of the first semiconductor layers 25, 23 can be shortened, which can simplify the manufacturing process of the solar cell.

An acidic solution such as hydrofluoric acid can be used as an etching solution for the lift-off layer 40. As an etching solution for the p-type semiconductor layer material film, an acidic solution such as a mixture solution in which ozone is dissolved in hydrofluoric acid, or a mixture solution of hydrofluoric acid and nitric acid, can be mentioned; and as an etching solution for the n-type semiconductor layer material film, an alkaline solution such as a potassium hydroxide aqueous solution can be mentioned.

Thereafter, as illustrated in FIG. 6D, the resist 90 is removed (first resist removing step). An organic solvent such as acetone can be used as an etching solution for the resist 90.

Next, both sides of the semiconductor substrate 11 are cleaned (first cleaning step). In the first cleaning step, for instance, an ozone treatment is performed followed by a hydrofluoric acid treatment. The term "hydrofluoric acid treatment" includes not only a treatment with hydrofluoric acid but also treatments with a mixture containing other types of acids (for instance, hydrochloric acid in the first cleaning step).

As mentioned above, the inventors of the present application have found that in this cleaning step, exposure of the back surface of the semiconductor substrate 11 in the second region 8 to the cleaning solution is the factor that lowers the lifetime of the carriers in the semiconductor substrate 11. In particular, it is anticipated that the cleaning solution remains in the valley of the texture structure of the semiconductor substrate 11, resulting in excessive etching.

In this regard, in the present embodiment, by suppressing the exposure of the back surface of the semiconductor substrate 11 during the patterning process of the first semiconductor layer 25, 23, the lifetime of the carriers in the semiconductor substrate 11 improves. In particular, by leaving the first semiconductor layers 25, 23 in the valley of the texture structure of the semiconductor substrate 11, this valley of the texture structure becomes shallow. Therefore, it is conjectured that the cleaning solution is suppressed from remaining in the valley of the texture structure of the semiconductor substrate 11, and excessive etching is also suppressed.

Next, as illustrated in FIG. 6E, for example, using a CVD method or a PVD method, the second intrinsic semiconductor layer material film 33Z and the second conductivity-type semiconductor layer material film 35Z (second semiconductor layer material film) are formed in sequence on the entire surface on the back surface side of the semiconductor substrate 11 (second semiconductor layer material film forming step).

Next, as illustrated in FIG. 6F, by utilizing a lift-off method adopting a lift-off layer (sacrificial layer), the second intrinsic semiconductor layer material film 33Z and the second conductivity-type semiconductor layer material film 35Z (second semiconductor layer material film) in the first region 7 are removed from the back surface side of the semiconductor substrate 11, to form the second intrinsic semiconductor layer 33 and the second conductivity-type semiconductor layer 35 (second semiconductor layer) thus patterned in the second region 8 (second semiconductor layer forming step).

Specifically, by removing the lift-off layer 40, the second intrinsic semiconductor layer material film 33Z and the second conductivity-type semiconductor layer material film 35Z (second semiconductor layer material film) on the lift-off layer 40 are removed, to form the second intrinsic semiconductor layer 33 and the second conductivity-type semiconductor layer (second semiconductor layer) in the second region 8. An acidic solution such as hydrofluoric acid can be used as a removal solution for the lift-off layer 40.

Thus, by employing the lift-off method using the lift-off layer (sacrificial layer) in the patterning (second patterning) of the second semiconductor layers 35, 33, the manufacturing process of the solar cell can be simplified.

Thereafter, similarly to the above, an optical adjustment layer 15 is formed on the entire surface on the light-receiving surface side of the semiconductor substrate 11 (not illustrated). The first electrode layer 27 and the second electrode layer 37 are formed on the back surface side of the semiconductor substrate 11 (not illustrated). Through the above steps, the back-junction solar cell 1 of the present embodiment as illustrated in FIGS. 1 to 3 is completed.

While the embodiments of the present disclosure have been described above, the present disclosure is not limited to these embodiments, and various changes and modifications can be made. For example, the embodiments have illustrated an example of the solar cell 1 having the texture structure on the back surface (and the light-receiving surface) of the semiconductor substrate 11, as illustrated in FIG. 2. However, the present disclosure is not limited to this, and is also applicable to a solar cell 1 that does not have a texture structure on the back surface (and the light-receiving surface) of the semiconductor substrate 11, as illustrated in FIG. 7.

In this solar cell 1 as well, the first semiconductor layers 25, 23 exist in some part between the semiconductor substrate 11 and the second semiconductor layers 35, 33, in the second region 8. In other words, in the second region 8, the first conductivity-type semiconductor layer 25 (and the first intrinsic semiconductor layer 23) exists in some part between the semiconductor substrate 11 and the second conductivity-type semiconductor layer (and the second intrinsic semiconductor layer 33).

As illustrated in FIG. 3, in the second region 8, the first semiconductor layers 25, 23, namely the first conductivity-type semiconductor layer 25 and the first intrinsic semiconductor layer 23, may exist in a sea shape (in other words, continuously) in the sea-island structure. Alternatively, in the second region 8, the first semiconductor layers 25, 23, namely the first conductivity-type semiconductor layer 25 and the first intrinsic semiconductor layer 23, may exist in an island shape (in other words, discontinuously) in the sea-island structure.

Figure 7:
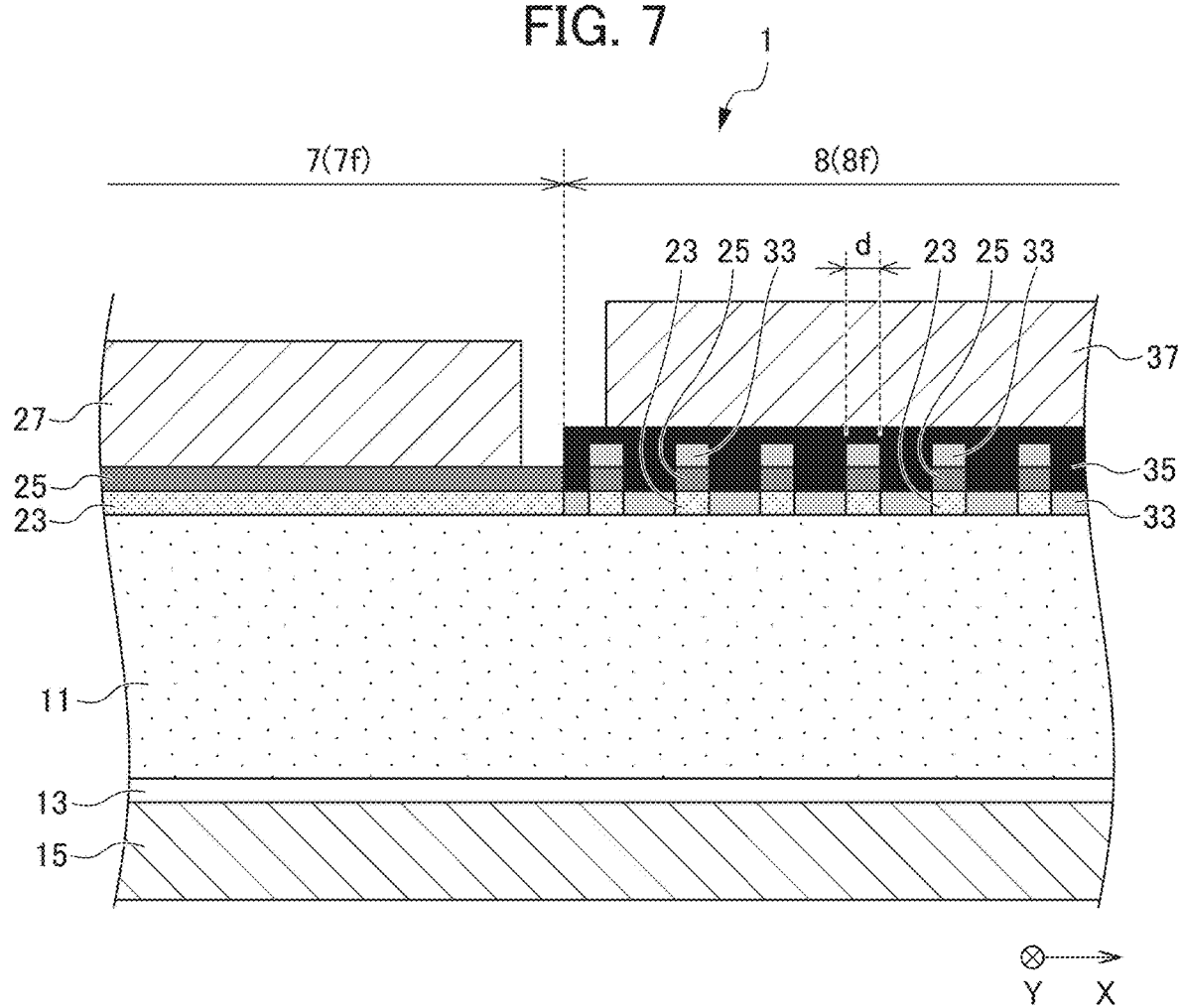
FIG. 7 is a cross-sectional view of the solar cell according to the Modification Example of the present embodiment, which is equivalent to the cross-sectional view along the line II-II in FIG. 1.

As illustrated in FIG. 7, the film thickness of the first semiconductor layers 25, 23 (namely the first conductivity-type semiconductor layer 25 and the first intrinsic semiconductor layer 23) in the second region 8 is thinner than the film thickness of the first semiconductor layers 25, 23 (namely the first conductivity-type semiconductor layer 25 and the first intrinsic semiconductor layer 23) in the first region 7. In particular, the film thickness of the first conductivity-type semiconductor layer 25 in the second region 8 is thinner than the film thickness of the first conductivity-type semiconductor layer 25 in the first region 7. In this case, the film thickness of the first intrinsic semiconductor layer 23 under the first conductivity-type semiconductor layer 25 in the second region 8 is the same as the film thickness of the first intrinsic semiconductor layer 23 under the first conductivity-type semiconductor layer 25 in the first region 7.

Note that in the second region 8, all of the first conductivity-type semiconductor layer may be etched, and only the first intrinsic semiconductor layer 23 may remain in some part between the semiconductor substrate 11 and the second conductivity-type semiconductor layer 35 (and the second intrinsic semiconductor layer 33). In this case, the film thickness of the first intrinsic semiconductor layer 23 remaining in the second region 8 becomes thinner than the film thickness of the first intrinsic semiconductor layer 23 in the first region 7.

If the second semiconductor layers 35, 33 collects minority carriers generated in the semiconductor substrate 11, the continuous distance d of the first semiconductor layers 25, 23 formed in the second region 8 is no more than half of the diffusion length L calculated from the lifetime $\tau$ of the minority carriers generated in the semiconductor substrate 11.

$$d < L/2$$

$$L = (D\tau)^{1/2}$$

D is the diffusion coefficient of the carriers.

In this manner, the gap of the second semiconductor layers 35, 33, which contact the semiconductor substrate 11 without going through the first semiconductor layers 25, 23, can be no more than half of the diffusion length L calculated from the lifetime τ of the minority carriers, which allows the second semiconductor layers 35, 33 to easily collect minority carriers.

In this solar cell 1 as well, the first semiconductor layers 25, 23 remain in some part of the second region 8 of the semiconductor substrate 11 during the patterning process of the first semiconductor layers 25, 23, which can suppress the exposure of the back surface of the semiconductor substrate 11. This can improve the lifetime of the carriers in the semiconductor substrate 11, and as a result, the performance of the solar cell 1 can be improved.

The embodiments above have described an example of the heterojunction solar cell 1 as illustrated in FIG. 2. However, the present disclosure is not limited to this and can also be applied to various types of solar cells such as a homojunction solar cell 1 as illustrated in FIG. 8.

In this solar cell 1 as well, in the second region 8, the first semiconductor layer 25 exists in some part between the semiconductor substrate 11 and the second semiconductor layer 35. In other words, in the second region 8, the first conductivity-type semiconductor layer 25 exists in some part between the semiconductor substrate 11 and the second conductivity-type semiconductor layer 35.

As illustrated in FIG. 3, in the second region 8, the first semiconductor layer 25, namely the first conductivity-type semiconductor layer 25, may exist in a sea shape (in other words, continuously) in the sea-island structure. Alternatively, in the second region 8, the first semiconductor layer 25, namely the first conductivity-type semiconductor layer 25, may exist in an island shape (in other words, discontinuously) in the sea-island structure.

As illustrated in FIG. 8, the film thickness of the first semiconductor layer 25 (namely the first conductivity-type semiconductor layer 25) in the second region 8 is thinner than the film thickness of the first semiconductor layer 25 (namely the first conductivity-type semiconductor layer 25) in the first region 7.

If the second semiconductor layer 35 collects minority carriers generated in the semiconductor substrate 11, the continuous distance d of the first semiconductor layer 25 formed in the second region 8 is no more than half of the diffusion length L calculated from the lifetime τ of the minority carriers generated in the semiconductor substrate 11.

$$d < L/2$$

$$L = (D \cdot \tau)^{1/2}$$

D is the diffusion coefficient of the carriers.

In this manner, the gap of the second semiconductor layer 35, which contacts the semiconductor substrate 11 without going through the first semiconductor layer 25, can be no more than half of the diffusion length L calculated from the lifetime τ of the minority carriers, which allows the second semiconductor layer 35 to easily collect minority carriers.

In this solar cell 1 as well, the first semiconductor layer 25 remains in some part of the second region 8 of the semiconductor substrate 11 during the patterning process of the first semiconductor layer 25, which can suppress the exposure of the back surface of the semiconductor substrate 11. This can improve the lifetime of the carriers in the semiconductor substrate 11, and as a result, the performance of the solar cell 1 can be improved.

Figure 9A:
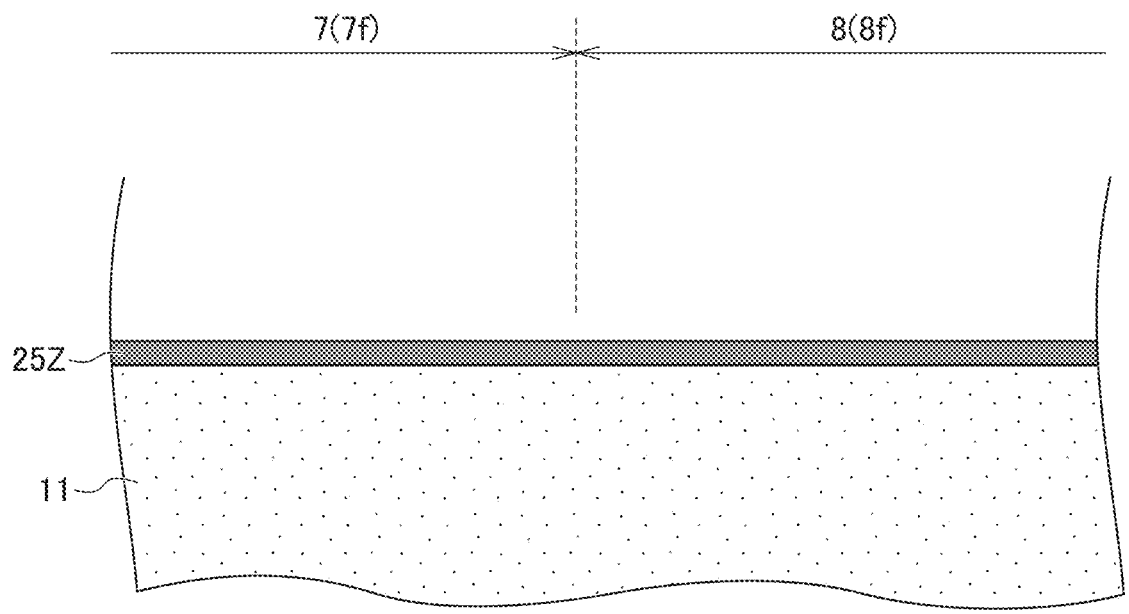
FIG. 9A is a diagram illustrating the first semiconductor layer material film forming step in the method of manufacturing a solar cell according to the Modification Example of the present embodiment.
Figure 9B:
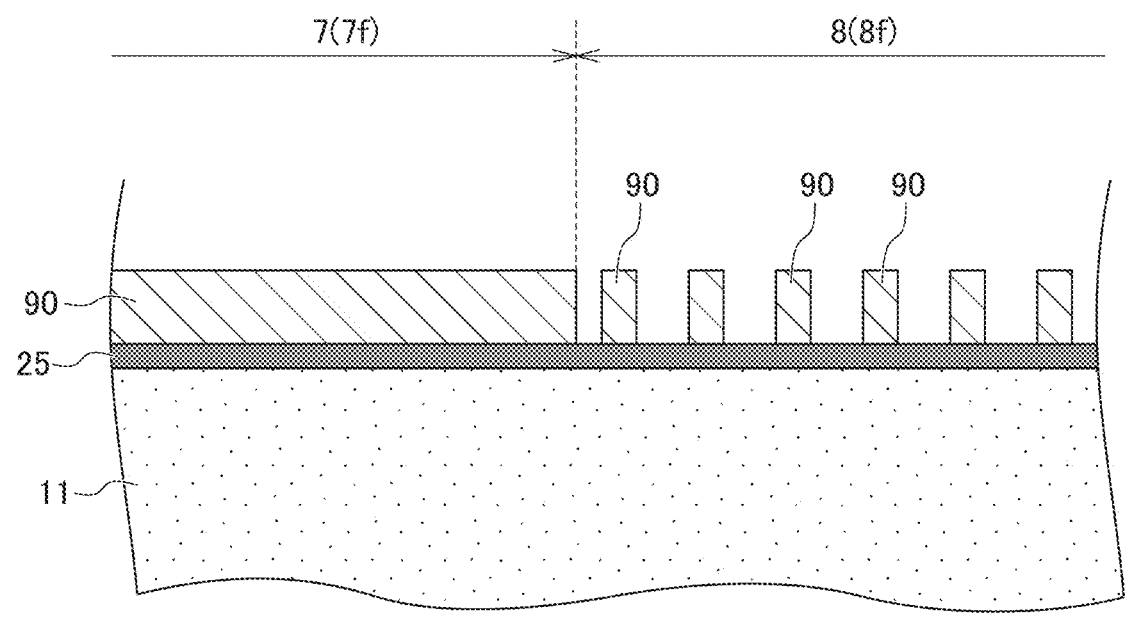
FIG. 9B is a diagram illustrating the first semiconductor layer forming step in the method of manufacturing a solar cell according to the Modification Example of the present embodiment.
Figure 9C:
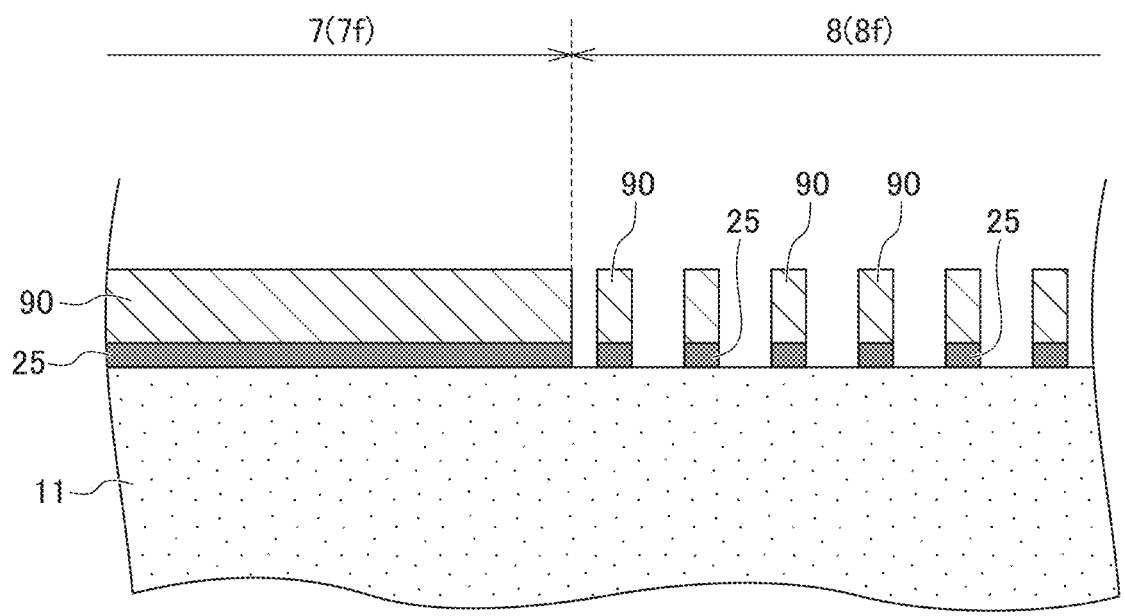
FIG. 9C is a diagram illustrating the first semiconductor layer forming step in the method of manufacturing a solar cell according to the Modification Example of the present embodiment.
Figure 9D:
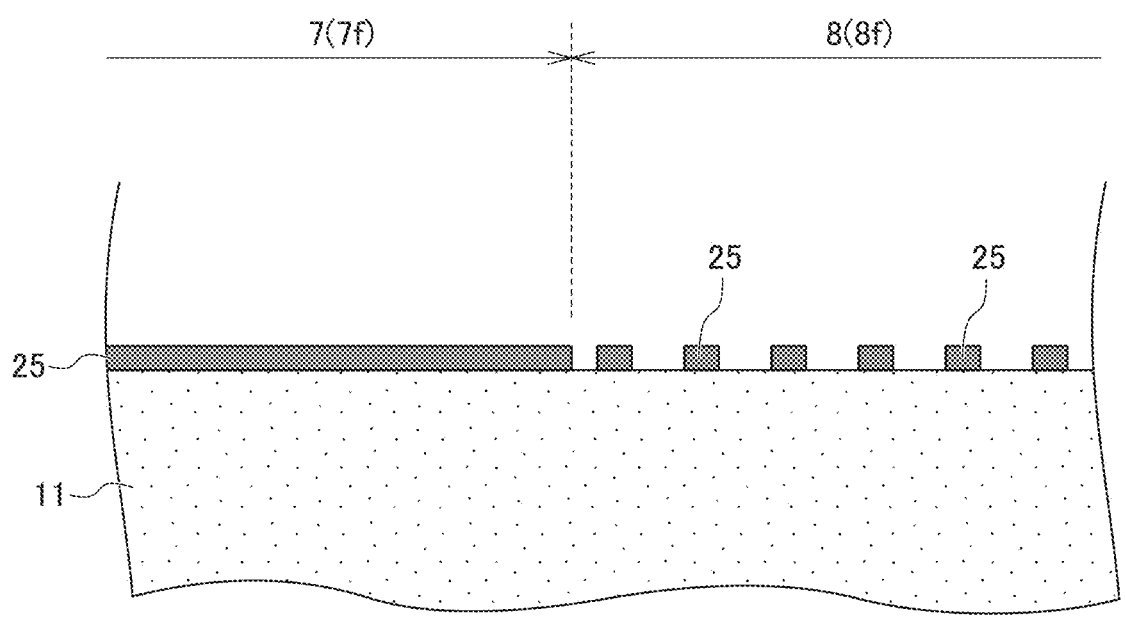
FIG. 9D is a diagram illustrating the first semiconductor layer forming step in the method of manufacturing a solar cell according to the Modification Example of the present embodiment.

Hereinafter, referring to FIGS. 9A to 9D, an example of a method of manufacturing the solar cell illustrated in FIG. 8, which represents the solar cells illustrated in FIGS. 7 and 8, will be described. FIG. 9A is a diagram illustrating the first semiconductor layer material film forming step in the method of manufacturing a solar cell according to the Modification Example of the present embodiment; and FIGS. 9B to 9D are diagrams illustrating the first semiconductor layer forming step in the method of manufacturing a solar cell according to the Modification Example of the present embodiment. The second semiconductor layer material film forming step and the second semiconductor layer forming step are the same as those in the aforementioned embodiments and the Modification Example, so the descriptions will be omitted. FIGS. 9A to 9D illustrate the back surface side of the semiconductor substrate 11, and omit the light-receiving surface side of the semiconductor substrate 11.

First, as illustrated in FIG. 9A, for example, using a CVD method (Chemical Vapor Deposition method) or a PVD method (Physical Vapor Deposition method), the first conductivity-type semiconductor layer material film 25Z (first semiconductor layer material film) is formed on the entire surface on the back surface side of the semiconductor substrate 11 (first semiconductor layer material film forming step).

Next, as illustrated in FIGS. 9B to 9D, similarly as mentioned above, by using a resist, the first conductivity-type semiconductor layer material film 25Z (first semiconductor layer material film) in the second region 8 on the back surface side of the semiconductor substrate 11 is removed, to form the first conductivity-type semiconductor layer 25 (first semiconductor layer) thus patterned in the first region 7 (first semiconductor layer forming step).

Specifically, as illustrated in FIG. 9B, a resist (first resist) 90 is formed in the first region 7 on the back surface side of the semiconductor substrate 11 (and on the entire surface on light-receiving surface side of the semiconductor substrate 11) (first resist forming step). At this time, in the second region 8 on the back surface side of the semiconductor substrate 11 as well, the resist (first resist) 90 is formed in a sea shape (in other words, continuously) in the sea-island structure or an island shape (in other words, discontinuously) in the sea-island structure.

Thereafter, as illustrated in FIG. 4C, by using the resist 90 as a mask, the first conductivity-type semiconductor layer material film 25Z (first semiconductor layer material film) in the second region 8 is etched, to form the first conductivity-type semiconductor layer (first semiconductor layer) thus patterned in the first region 7 (first semiconductor layer forming step).

At this time, when etching in the second region 8 by using the resist 90 as a mask, the first semiconductor layer 25, namely the first conductivity-type semiconductor layer 25, is left on the semiconductor substrate 11 in a sea shape (in other words, continuously) in the sea-island structure or an island shape (in other words, discontinuously) in the sea-island structure (see FIG. 3).

Thereafter, as illustrated in FIG. 9D, the resist 90 is removed (first resist removing step).

What is claimed is:
1. A back-junction solar cell, the solar cell comprising:
a semiconductor substrate;
a first semiconductor layer on a first region as a part of one principal surface side of the semiconductor substrate; and a second semiconductor layer on a second region as another part of the one principal surface side of the semiconductor substrate,
wherein, in the second region, the first semiconductor layer exists in a part between the semiconductor substrate and the second semiconductor layer, and the first semiconductor layer is in a sea shape or an island shape in a sea-island structure.

2. The solar cell according to claim 1, wherein
the first semiconductor layer includes a first conductivity-type semiconductor layer, and
the second semiconductor layer includes a second conductivity-type semiconductor layer.

3. The solar cell according to claim 2, wherein
the second semiconductor layer includes an intrinsic semiconductor layer on the semiconductor substrate side of the second conductivity-type semiconductor layer,
the semiconductor substrate includes a crystalline silicon material,
the first conductivity-type semiconductor layer, the second conductivity-type semiconductor layer, and the intrinsic semiconductor layer include an amorphous silicon material, and
the solar cell is a heterojunction type.

4. The solar cell according to claim 3, wherein
the first semiconductor layer includes an intrinsic semiconductor layer on the semiconductor substrate side of the first conductivity-type semiconductor layer.

5. The solar cell according to claim 1, wherein
an uneven structure is on the one principal surface side of the semiconductor substrate, and
wherein, in the second region, the first semiconductor layer exists at least in a part of a valley of the uneven structure of the semiconductor substrate.

6. The solar cell according to claim 5, wherein
the uneven structure is a fine pyramidal texture structure.

7. The solar cell according to claim 1, wherein
a film thickness of the first semiconductor layer in the second region is thinner than a film thickness of the first semiconductor layer in the first region.

8. The solar cell according to claim 2, wherein
a film thickness of the first conductivity-type semiconductor layer in the second region is thinner than a film thickness of the first conductivity-type semiconductor layer in the first region.

9. The solar cell according to claim 1, wherein
when the second semiconductor layer collects minority carriers generated in the semiconductor substrate, a continuous distance of the first semiconductor layer formed in the second region is no more than half of a diffusion length calculated from a lifetime of the minority carriers generated in the semiconductor substrate.

10. The solar cell according to claim 2, wherein
an uneven structure is on the one principal surface side of the semiconductor substrate, and
wherein, in the second region, the first semiconductor layer exists at least in a part of a valley of the uneven structure of the semiconductor substrate.

11. The solar cell according to claim 3, wherein
an uneven structure is on the one principal surface side of the semiconductor substrate, and
wherein, in the second region, the first semiconductor layer exists at least in a part of a valley of the uneven structure of the semiconductor substrate.

12. The solar cell according to claim 4, wherein
an uneven structure is on the one principal surface side of the semiconductor substrate, and
wherein, in the second region, the first semiconductor layer exists at least in a part of a valley of the uneven structure of the semiconductor substrate.

13. The solar cell according to claim 2, wherein
a film thickness of the first semiconductor layer in the second region is thinner than a film thickness of the first semiconductor layer in the first region.

14. The solar cell according to claim 3, wherein
a film thickness of the first semiconductor layer in the second region is thinner than a film thickness of the first semiconductor layer in the first region.

15. The solar cell according to claim 3, wherein
a film thickness of the first conductivity-type semiconductor layer in the second region is thinner than a film thickness of the first conductivity-type semiconductor layer in the first region.

16. The solar cell according to claim 2, wherein
when the second semiconductor layer collects minority carriers generated in the semiconductor substrate, a continuous distance of the first semiconductor layer formed in the second region is no more than half of a diffusion length calculated from a lifetime of the minority carriers generated in the semiconductor substrate.

17. A method of manufacturing a back-junction solar cell, the solar cell including: a semiconductor substrate, a first semiconductor layer on a first region as a part of one principal surface side of the semiconductor substrate, and a second semiconductor layer on a second region as another part of the one principal surface side of the semiconductor substrate, the method comprising:
forming a material film of the first semiconductor layer on the one principal surface side of the semiconductor substrate;
forming a resist on the material film of the first semiconductor layer in the first region;
etching the material film of the first semiconductor layer in the second region using the resist as a mask, to form the first semiconductor layer thus patterned in the first region;
removing the resist; and
forming the second semiconductor layer patterned in the second region,
wherein
the etching is performed to leave the first semiconductor layer in a sea shape or an island shape in a sea-island structure in the second region, and
in the forming of the second semiconductor layer, the first semiconductor layer exists in a part between the semiconductor substrate and the second semiconductor layer.

18. The method of manufacturing a solar cell according to claim 17, wherein
an uneven structure is formed on the one principal surface side of the semiconductor substrate,
the etching is performed to leave the first semiconductor layer at least in a part of a valley of the uneven structure of the semiconductor substrate, in the second region, and
in the forming of the second semiconductor layer, the first semiconductor layer exists at least in a part of the valley of the uneven structure of the semiconductor substrate, in the second region.

19. The method of manufacturing a solar cell according to claim 18, wherein
in the forming of the resist, a local resist is further formed at least in a part of the valley of the uneven structure of the semiconductor substrate.

20. The method of manufacturing a solar cell according to claim 17, wherein
in the forming of the resist, the resist is further formed in a sea shape or an island shape in the sea-island structure on the material film of the first semiconductor layer in the second region.

\* \* \* \* \*